(12) United States Patent
Iwaki

(10) Patent No.: US 10,355,183 B2
(45) Date of Patent: Jul. 16, 2019

(54) LED PACKAGE

(71) Applicant: ROHM CO., LTD., Kyoto-shi, Kyoto (JP)

(72) Inventor: Kunio Iwaki, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/264,215

(22) Filed: Sep. 13, 2016

(65) Prior Publication Data

US 2017/0084803 A1    Mar. 23, 2017

(30) Foreign Application Priority Data

Sep. 18, 2015  (JP) .................................. 2015-185522
Jul. 20, 2016  (JP) .................................. 2016-142006

(51) Int. Cl.

| | |
|---|---|
| H01L 33/58 | (2010.01) |
| H01L 33/60 | (2010.01) |
| H01L 33/48 | (2010.01) |
| H01L 33/62 | (2010.01) |
| H01L 33/56 | (2010.01) |
| H01L 33/50 | (2010.01) |
| H01L 33/54 | (2010.01) |
| H01L 33/64 | (2010.01) |
| H01L 29/866 | (2006.01) |
| H01L 27/02 | (2006.01) |
| H01L 25/16 | (2006.01) |

(52) U.S. Cl.
CPC ............ *H01L 33/58* (2013.01); *H01L 25/167* (2013.01); *H01L 27/0248* (2013.01); *H01L 29/866* (2013.01); *H01L 33/483* (2013.01); *H01L 33/502* (2013.01); *H01L 33/54* (2013.01); *H01L 33/56* (2013.01); *H01L 33/60* (2013.01); *H01L 33/62* (2013.01); *H01L 33/642* (2013.01); *H01L 2224/48091* (2013.01); *H01L 2224/48227* (2013.01); *H01L 2224/73265* (2013.01)

(58) Field of Classification Search
CPC . H01L 2224/48091; H01L 2924/00014; H01L 2924/00; H01L 2924/181; H01L 33/62
See application file for complete search history.

(56) References Cited

U.S. PATENT DOCUMENTS

| | | | |
|---|---|---|---|
| 2005/0072981 A1* | 4/2005 | Suenaga | H01L 33/486 257/88 |
| 2012/0080674 A1* | 4/2012 | Shimizu | H01L 24/97 257/48 |
| 2015/0138780 A1* | 5/2015 | Yoshizawa | F21V 29/673 362/326 |

FOREIGN PATENT DOCUMENTS

| | | |
|---|---|---|
| JP | 2007-88075 A | 4/2007 |
| JP | 2011-159951 A | 8/2011 |

\* cited by examiner

*Primary Examiner* — Tony Tran
(74) *Attorney, Agent, or Firm* — Hamre, Schumann, Mueller & Larson, P.C.

(57) ABSTRACT

An LED package includes an LED element, a board having an obverse face and a mounting face opposite to the obverse face, a conductive part formed on both the obverse face and the mounting face of the board and having an installation face upon which the LED element is disposed, a case having a reflective face that encloses the LED element and defines a through area, and a lid having a top face and a back face. The lid is disposed on the case so that the back face of the lid is directed to the case. The back face of the lid is formed with a convex lens portion protruding toward the LED element so as to be accommodated in the through area of the case.

34 Claims, 24 Drawing Sheets

LED PACKAGE

BACKGROUND OF THE INVENTION

1. Field of the Invention

The present invention relates to an LED package used for remote sensors, various lighting apparatuses and the like.

2. Description of Related Art

As a mode of an LED package, conventionally, a mode is widely known in which an LED element is disposed on a board that has a conductive part formed thereon, a case that encloses the LED element is arranged on the board, and a recess formed by the board and the case is filled with sealing resin. The internal surface of the case functions as a reflector that reflects light emitted from the LED element. The improvement in efficiency of extracting the light emitted from the LED element is intended by the case.

Meanwhile, in the LED package, when light is incident on the interface (opening face) between the sealing resin and the air, the absolute refractive index changes with the interface as the boundary, and thus if the incident angle of the light exceeds a critical angle defined by Snell's law, the light will be reflected by the interface. If such reflection is repeated, as the optical path becomes longer, the light is absorbed by the sealing resin, and there is a risk that the efficiency of extracting the light emitted from the LED element will conversely decrease.

In order to solve such a problem, for example, JP-A-2011-159951 discloses an LED package that is provided with a convex lens protruding in the light emission direction in order to focus the light emitted from the LED element and to increase the light extraction efficiency. Also, JP-A-2007-88075 discloses an LED package that can obtain the same effect as the LED package disclosed in JP-A-2011-159951 by shaping the sealing resin filled in the case to be convex so as to protrude in the light emission direction. However, both the LED packages disclosed in JP-A-2011-159951 and JP-A-2007-88075 have a convex projection formed therein, and thus there is a problem in that it is difficult to reduce the size and height of the LED packages.

SUMMARY OF THE INVENTION

The present invention, in light of the above situation, aims to provide an LED package that can increase the light extraction efficiency while achieving a reduction in the height and size of the LED package.

According to an aspect of the present invention, there is provided an LED package including: an LED element; a board having an obverse face and a mounting face opposite to the obverse face; a conductive part formed on both the obverse face and the mounting face of the board and having an installation face upon which the LED element is disposed; a case having an end face, a supporting face and a reflective face, where the end face and the supporting face are opposite to each other, the reflective face is joined to both the end face and the supporting face while also enclosing the LED element, the case is formed with a through area defined by the reflective face, and the supporting face is arranged to face the board; and a lid configured to allow light to pass therethrough and having a top face and a back face that are opposite to each other, where the lid is disposed on the case so that the back face of the lid faces the end face of the case. Further, the back face of the lid is formed with a convex lens portion protruding toward the LED element, and the lens portion is accommodated in the through area of the case.

With the above arrangements, for example, the lens portion formed on the lid is accommodated in the through area of the case. Thus, it is possible to focus the light emitted from the LED element properly, thereby increasing the light extraction efficiency. Also, the lens portion is accommodated in the through area, which is advantageous to reducing the height and size of the LED package.

Other features and advantages of the present invention will become more apparent from the detailed description given below with reference to the attached drawings.

DETAILED DESCRIPTION OF THE PREFERRED EMBODIMENTS

Figure 1:
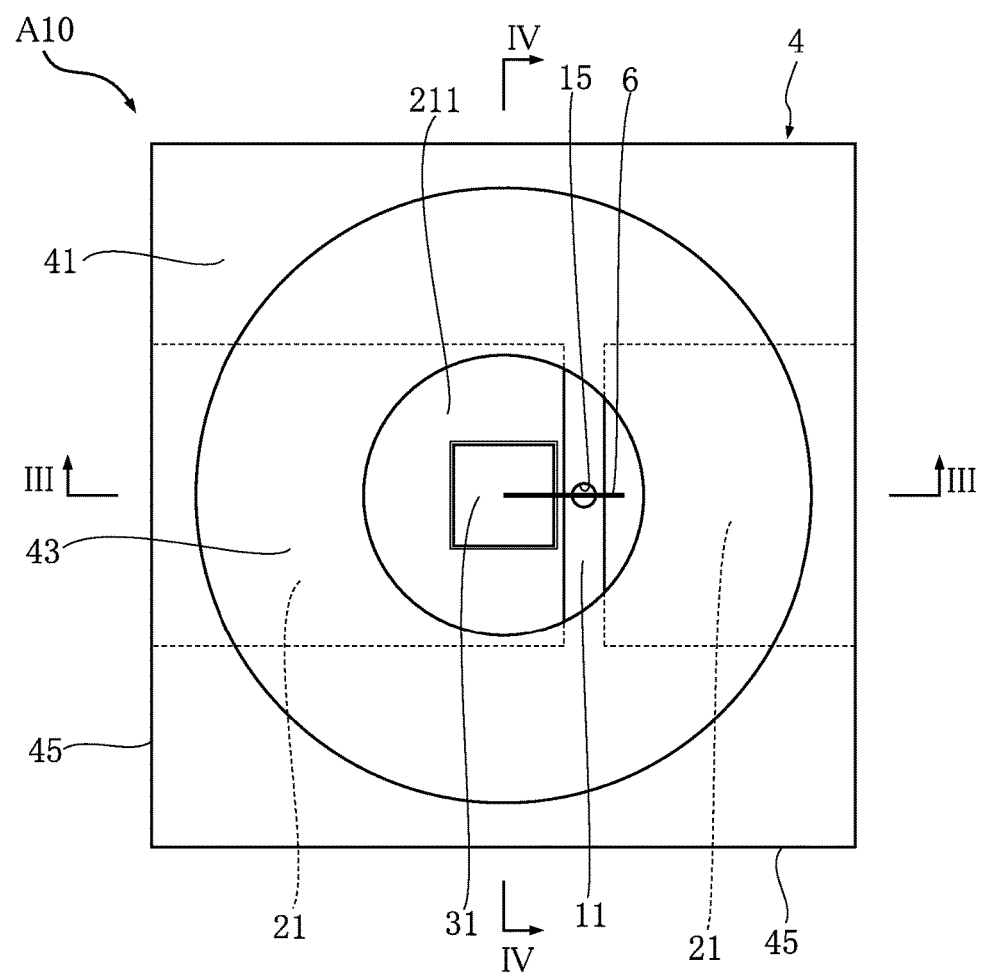
FIG. 1 is a plan view of an LED package according to a first embodiment of the present invention (a lid is omitted).

Preferred embodiments of the present invention will be described below with reference to the attached drawings.

First Embodiment

An LED package A10 according to a first embodiment of the present invention will be described with reference to FIGS. 1 to 5. The LED package A10 shown in these figures is surface-mounted on the circuit board of a remote sensor, for example. The LED package A10 according to this embodiment is provided with a base board or substrate 1, conductive parts 21, a communication conductive part 22, an LED element 31, a junction layer 32, a case 4, a lid 5 and a bonding wire 6. The LED package A10 is rectangular in plan view.

Figure 2:
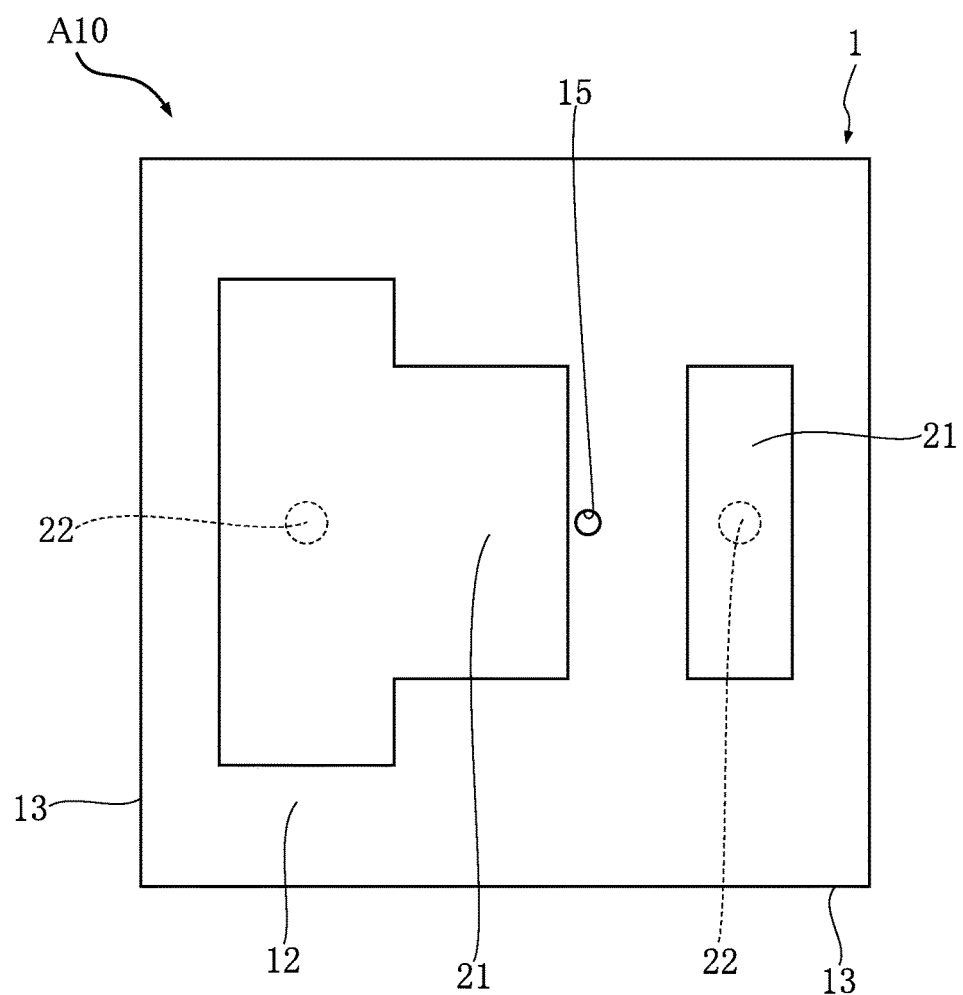
FIG. 2 is a bottom view of the LED package shown in FIG. 1.
Figure 3:
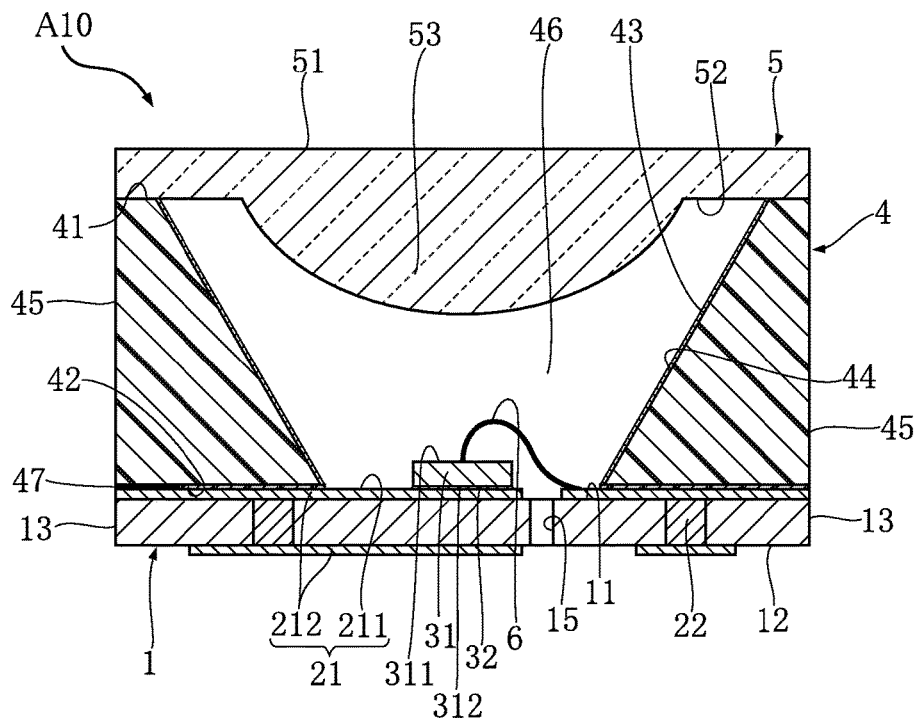
FIG. 3 is a cross-sectional view taken along a line in FIG. 1.
Figure 4:
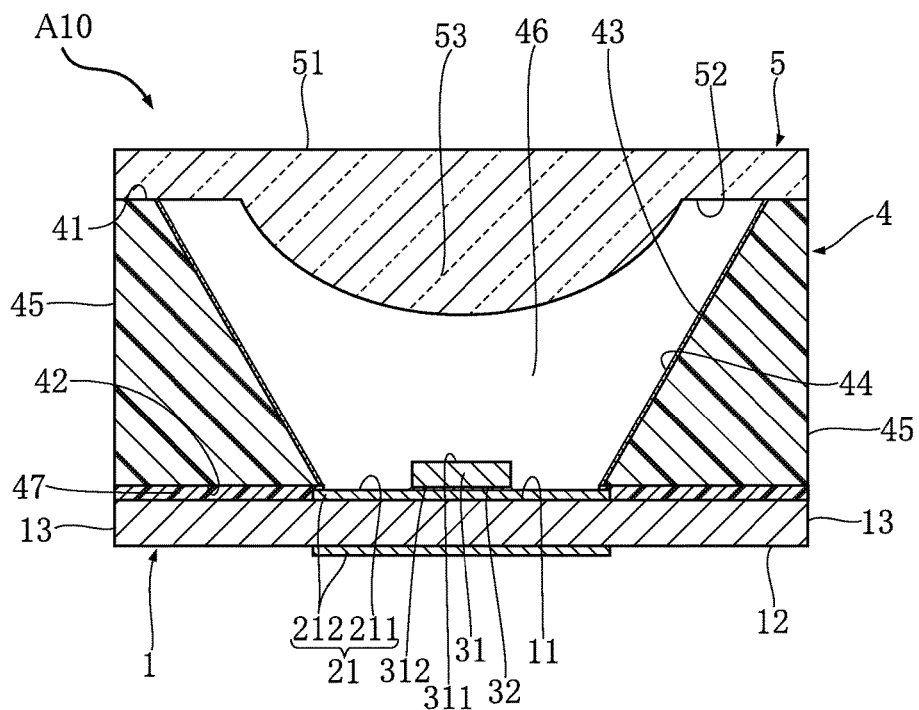
FIG. 4 is a cross-sectional view taken along a line IV-IV in FIG. 1.

FIG. 1 is a plan view of the LED package A10, and the lid 5 is omitted for convenience of understanding. FIG. 2 is a bottom view of the LED package A10. FIG. 3 is a cross-sectional view taken along a line III-III in FIG. 1. FIG. 4 is a cross-sectional view taken along a line IV-IV in FIG. 1.

Figure 5:
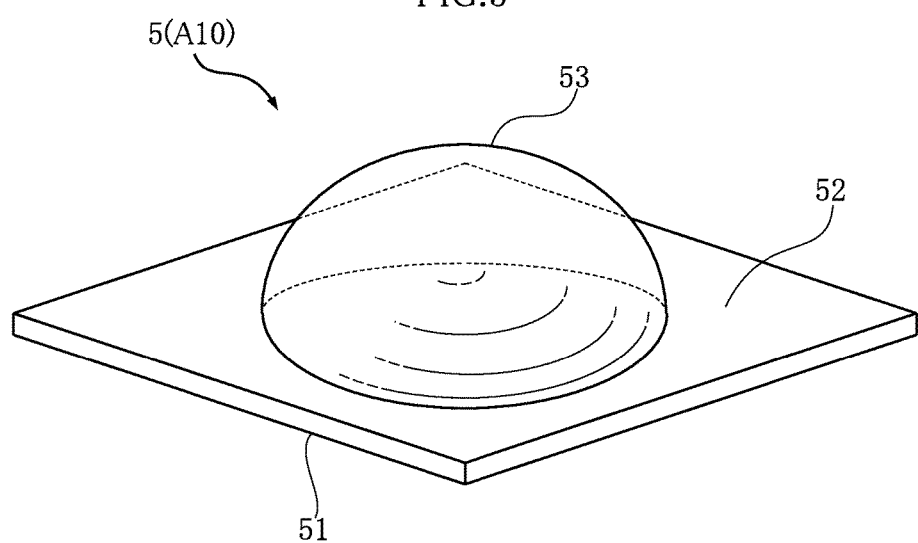
FIG. 5 is a perspective view of the lid of the LED package shown in FIG. 1.

FIG. 5 is a perspective view of the lid 5 of the LED package A10. Note that in FIGS. 3 and 4, the lid 5 is illustrated and not omitted.

The board 1 is for supporting the LED element 31 and the case 4, and mounting the LED package A10 on a circuit board. The board 1 is an electrical insulator. For example, the board 1 is made of ceramic such as alumina ($Al_2O_3$), or glass epoxy resin. The material of the board 1 is preferably a material having relatively high thermal conductivity in order to make it easy to release the heat generated from the LED element 31 to the outside when the LED package A10 is used. In this embodiment, the board 1 has an obverse face 11, a mounting face 12 and a plurality of board side faces 13.

The obverse face 11 is the upper face of the board 1 shown in FIGS. 3 and 4. In the LED package A10, the LED element 31 is positioned in the direction in which the obverse face 11 is directed. The mounting face 12 is the lower face of the board 1 shown in FIGS. 3 and 4. The mounting face 12 is a face used when mounting the LED package A10 on a target circuit board. As shown in FIGS. 3 and 4, both the obverse face 11 and the mounting face 12 are orthogonal to the thickness direction of the board 1, and are flat. Also, the obverse face 11 and the mounting face 12 are directed to opposite sides to each other in the thickness direction of the board 1.

As shown in FIGS. 3 and 4, the plurality of board side faces 13 are four faces that are sandwiched between the obverse face 11 and the mounting face 12 in the thickness direction of the board 1, and are directed to the outside of the LED package A10. All of the plurality of board side faces 13 are orthogonal to the obverse face 11 and the mounting face 12, and are flat.

As shown in FIGS. 1 to 3, a ventilation hole 15 that passes through the board 1 from the obverse face 11 to the mounting face 12, and allows the air outside of the LED package A10 to circulate is formed in the board 1. The ventilation hole 15 leads to a through area 46 formed on the case 4, which will be described later. In place of the through hole provided in the board 1 as in this embodiment, the ventilation hole 15 may be a through groove that is depressed from a supporting face 42 of the case 4 to be described later, and that allows air to mutually circulate inside and outside of the through area 46.

The conductive parts 21 are members that constitute a portion of the conduction path of the LED element 31 and a target circuit board, and are formed on both the obverse face 11 and the mounting face 12. In this embodiment, the conductive parts 21 formed on the obverse face 11 are electrically connected to the LED element 31 via the junction layer 32 and the bonding wire 6. In this embodiment, the conductive parts 21 have an installation face 211, and also include a plating layer 212. As shown in FIGS. 1 and 2, on the obverse face 11 and the mounting face 12, the installation faces 211 are formed so as to be separated from each other. Note that both the conductive parts 21 formed on the obverse face 11 are formed so as to be in contact with the board side faces 13.

As shown in FIGS. 1, 3 and 4, the installation face 211 is a portion of the surface of the plating layer 212 that is directed in the same direction as the obverse face 11. The LED element 31 is disposed on the installation face 211 using die bonding. The plating layer 212 is constituted by metal layers laminated on each other. In this embodiment, the plating layer 212 is formed by electrolytic plating, and has a Cu layer, a Ni layer and an Au layer laminated in this order from the obverse face 11 or the mounting face 12 toward the outside.

As shown in FIGS. 2 and 3, the communication conductive part 22 is a member that serves as a conduction path for bringing the conductive part 21 formed on the obverse face 11 and the conductive part 21 formed on the mounting face 12 into electrical connection with each other. The communication conductive part 22 is formed so as to be embedded in the board 1, and is exposed from both the obverse face 11 and the mounting face 12. Both the portions of the communication conductive part 22 exposed from the obverse face 11 and the mounting face 12 are covered by the conductive parts 21. In this embodiment, the shape of the communication conductive part 22 is columnar. The communication conductive part 22 is made of Cu, for example.

Note that modes of arrangement of the conductive parts 21 and the communication conductive part 22 shown in FIGS. 1 to 4 are examples, and the mode of arrangement of the conductive parts 21 and the communication conductive part 22 in an actual LED package A10 is not limited thereto.

The LED element 31 is a light-emitting element serving as a light source of the LED package A10, and is a semiconductor element obtained by laminating a plurality of semiconductor layers on each other by pn-junction, for example. When a current flows in the LED package A10, the LED element 31 emits light. Depending on the substances that constitute the semiconductor layer, the LED element 31 emits blue light, red light, green light or the like. In this embodiment, a p-side electrode (anode) is formed on an element obverse face 311 that is the upper face of the LED element 31 shown in FIGS. 3 and 4, and an n-side electrode (cathode) is formed on an element back face 312 that is the lower face of the LED element 31 shown in FIGS. 3 and 4. Also, the light-emitting portion of the LED element 31 is formed on the element obverse face 311 along with the p-side electrode. The bonding wire 6 is connected to the p-side electrode, and the n-side electrode is electrically connected to the conductive part 21 formed on the obverse face 11 via the junction layer 32.

As shown in FIGS. 3 and 4, the junction layer 32 is a conductor interposed between the LED element 31 and the installation face 211. The LED element 31 is disposed on the installation face 211 by being adhered to the junction layer 32. In addition, the junction layer 32 is a conductor, and thereby the junction layer 32, the conductive parts 21 and the communication conductive part 22 constitute a portion of a conduction path of the LED element 31 and the target circuit board. The junction layer 32 is made of Ag paste, for example.

The case 4 is a member arranged on the obverse face 11 so as to enclose the LED element 31. The case 4 functions as a reflector that reflects light emitted from the LED element 31. The case 4 is made of epoxy resin or PPA (polyphthalamide), for example, and is an electrical insulator. In this embodiment, the case 4 has an upper end face 41, a lower supporting face 42, a reflective face 43, a mirror surface plating layer 44, a plurality of case side faces 45, and an adhesive layer 47.

The end face 41 is the upper face of the case 4 shown in FIGS. 3 and 4. The supporting face 42 is the lower face of the case 4 shown in FIGS. 3 and 4. As shown in FIGS. 3 and 4, both the end face 41 and the supporting face 42 are orthogonal to the thickness direction of the case 4, and are flat. In addition, the end face 41 and the supporting face 42 are directed to opposite sides to each other in the thickness direction of the case 4. The case 4 is arranged such that the supporting face 42 faces the obverse face 11.

As shown in FIGS. 1, 3 and 4, the reflective face 43 is a curved face formed so as to be joined to the end face 41 and the supporting face 42 and to enclose the LED element 31. In this embodiment, the reflective face 43 is inclined relative to the supporting face 42 at a certain angle. Therefore, in the case 4, the area of the supporting face 42 is greater than the area of the end face 41.

As shown in FIGS. 3 and 4, the mirror surface plating layer 44 is a metal layer formed so as to cover the reflective face 43. The mirror surface plating layer 44 is formed by electroless plating. In this embodiment, any of an Au layer, an Ag layer, a Zn layer and an alloy layer of Au and Co can be selected as the mirror surface plating layer 44. Note that in the case 4, a state may be adopted in which the mirror surface plating layer 44 is omitted, and the reflective face 43 that is colored white is exposed.

As shown in FIGS. 3 and 4, the plurality of case side faces 45 are four faces that are arranged between the end face 41 and the supporting face 42 in the thickness direction of the case 4, and are directed to the outside of the LED package A10. All of the plurality of case side faces 45 are orthogonal to the obverse face 11 and the mounting face 12, and are flat. In addition, all of the plurality of case side faces 45 and the respective plurality of board side faces 13 are flush.

As shown in FIGS. 1, 3 and 4, the through area 46 is a hollow area formed in the case 4 and mainly defined by the reflective face 43. More precisely, since the through area 46 does not extend upward beyond the end face 41, and does not extend downward beyond the supporting face 42, it can be said that the through area 46 is defined by the end face 41, the supporting face 42 and the reflective face 43. In this embodiment, the shape of the through area 46 is a truncated cone in which the area of the upper base along the end face 41 is greater than the area of the lower base along the supporting face 42. Therefore, the planar view shape of the through area 46 is circular. In addition, in this embodiment, a portion of the LED element 31 is accommodated in the through area 46.

As shown in FIGS. 3 and 4, the adhesive layer 47 is a member interposed between the supporting face 42 and the obverse face 11, or between the supporting face 42 and the conductive part 21. The case 4 is arranged on the board 1 by being adhered to the adhesive layer 47. In this embodiment, the adhesive layer 47 is made of ultraviolet-curable acrylic resin or epoxy resin, for example.

The lid 5 is a member that covers the case 4 and is configured to allow light to pass therethrough. The lid 5 has a top face 51, a back face 52 and a lens portion 53. The top face 51 is the upper face of the lid 5 shown in FIGS. 3 and 4. The back face 52 is the lower face of the lid 5 shown in FIGS. 3 and 4. As shown in FIGS. 3 to 5, both the top face 51 and the back face 52 are orthogonal to the thickness direction of the lid 5 and are flat. Moreover, the top face 51 and the back face 52 are directed to opposite sides to each other in the thickness direction of the lid 5. The lid 5 covers the case 4 such that the back face 52 is directed to the end face 41. The lid 5 is made of synthetic resin or glass.

As shown in FIGS. 3 to 5, the lens portion 53 is a convex portion protruding from the back face 52 toward the LED element 31. The surface of the lens portion 53 is a curved face. In the LED package A10, the lens portion 53 is accommodated in the through area 46.

The bonding wire 6 is a metal wiring for connecting the LED element 31 to the conductive part 21 on which the LED element 31 is not disposed among the conductive parts 21 formed on the obverse face 11. As shown in FIG. 1, the bonding wire 6 according to this embodiment is formed in one location. The bonding wire 6 is made of Au, for example.

Next, the actions and effects of the LED package A10 will be described.

According to this embodiment, the case 4 arranged on the board 1 of the LED package A10 has the end face 41 and the supporting face 42 that are directed to opposite sides to each other, and the reflective face 43 formed so as to be joined to the end face 41 and the supporting face 42 and to enclose the LED element 31. Also, the lens portion 53 that protrudes from the back face 52 toward the LED element 31 is formed on the lid 5 arranged so as to cover the case 4, and the lens portion 53 is accommodated in the through area 46 formed in the case 4 by the end face 41, the supporting face 42 and the reflective face 43. With such a configuration, the lens portion 53 focuses light emitted from the LED element 31, and thereby the light extraction efficiency can be increased. Moreover, the lens portion 53 is accommodated in the through area 46, and thereby a reduction in the height and size of the LED package A10 can be achieved. Therefore, it becomes possible to increase the light extraction efficiency while achieving a reduction in the height and size of the LED package A10.

The planar view shape of the through area 46 according to this embodiment is circular, and the distance from the center of the element obverse face 311 to the line of intersection of the reflective face 43 and a plane orthogonal to the thickness direction of the case 4 is constant throughout the entire circumference of that line of intersection. Therefore, the length of the path of light that is emitted from the LED element 31 and reaches the reflective face 43 is uniform in the through area 46, and thereby biased luminous flux can be suppressed.

The reflective face 43 is inclined relative to the supporting face 42, and thereby when the light emitted from the LED element 31 is reflected by the reflective face 43, the reflected light can be efficiently guided to the lens portion 53. In addition, covering the reflective face 43 by the mirror surface plating layer 44 constituted by a metal layer and coloring the reflective face 43 white make it possible to increase the reflectivity of the light emitted from the LED element 31. Therefore, these actions and effects are suitable for increasing the light extraction efficiency.

The ventilation hole 15 that passes through the board 1 from the obverse face 11 to the mounting face 12 and allows the air outside of the LED package A10 to circulate is formed in the board 1. The ventilation hole 15 leads to the through area 46, and thus the air circulates in and out of the through area 46 via the ventilation hole 15. When the LED package A10 is used, there are cases where the air in the through area 46 is thermally expanded by the heat generated from the LED element 31 and thereby the pressure increases. There is a risk that that pressure will damage members of the LED package A10 such as the lid 5. Therefore, by providing this ventilation hole 15, it is possible to suppress the increase in pressure of the air in the through area 46, and to prevent damage to the members of the LED package A10.

FIGS. 6 to 39 show modified examples of the first embodiment of the present invention as well as other embodiments and modified examples thereof. Note that in these figures, the same reference numerals are given to constituent elements that are the same as or resemble those of the above-described LED package A10, and overlapping description is omitted.

First Modified Example of First Embodiment

Figure 6:
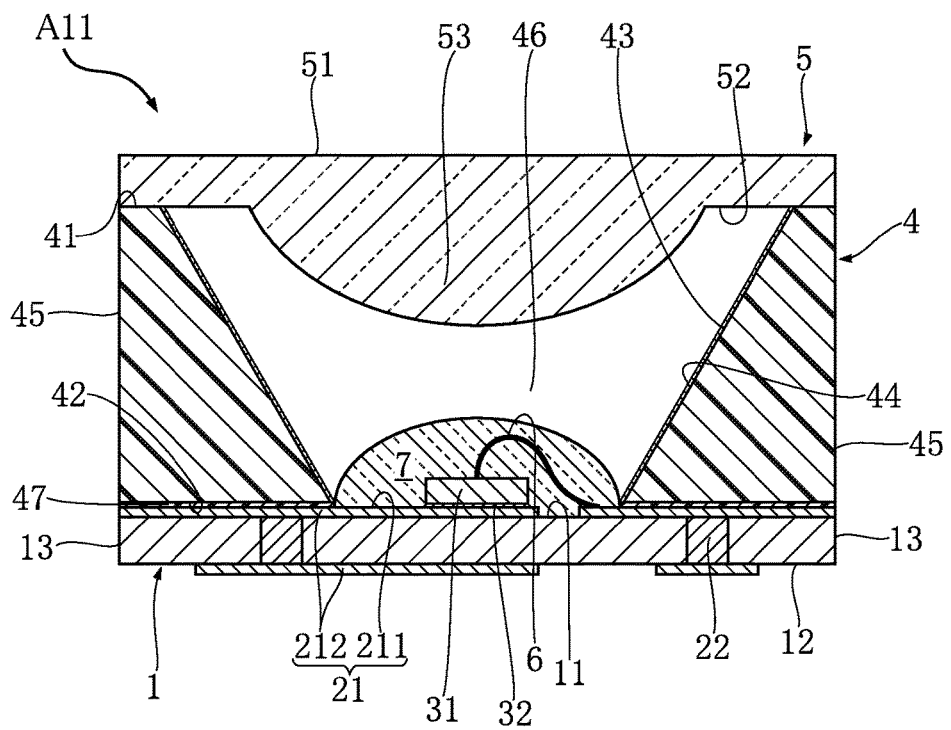
FIG. 6 is a cross-sectional view of an LED package according to a first modified example of the first embodiment of the present invention.

An LED package A11 according to a first modified example of the first embodiment of the present invention will be described with reference to FIG. 6. FIG. 6 is a cross-sectional view of the LED package A11, and the cross-sectional position thereof is the same as in FIG. 3.

The LED package A11 of this modified example is provided with sealing resin 7 in contrast to the above-described LED package A10. The sealing resin 7 is a synthetic resin that covers the LED element 31 and allows light to pass therethrough, and in this modified example, is composed of silicone resin. The sealing resin 7 may be a synthetic resin containing a phosphor and configured to allow light to pass therethrough, and more specifically, may also be silicone resin containing a phosphor. For example, if the LED element 31 emits blue light, white light is emitted from the LED package A11 by using the sealing resin 7 containing a yellow-color phosphor. If the LED element 31 emits purple near-ultraviolet rays, white color light for which higher color rendering properties are ensured is emitted from the LED package A11 by using the sealing resin 7 containing phosphors of three colors, namely, red, blue and green. In this modified example, a portion of the through area 46 is filled with the sealing resin 7, and the shape of the sealing resin 7 is convex. Note that the board 1 of the LED package A11 does not have the ventilation hole 15 formed therein, unlike the LED package A10.

According to this modified example, it also becomes possible to increase the light extraction efficiency while achieving a reduction in the height and size of the LED package A11. In this modified example, the LED package A11 is further provided with the sealing resin 7 that covers the LED element and allows light to pass therethrough. The absolute refractive index of the sealing resin 7 is greater than that of air, and thus when light emitted from the LED element 31 propagates through the sealing resin 7, the angle formed by the emission direction of the light (the thickness direction of the case 4) is smaller than the angle formed when the light propagates through the atmosphere based on Snell's law. Therefore, it becomes possible to further increase the light extraction efficiency of the LED package A11 compared to the LED package A10.

Second Modified Example of First Embodiment

Figure 7:
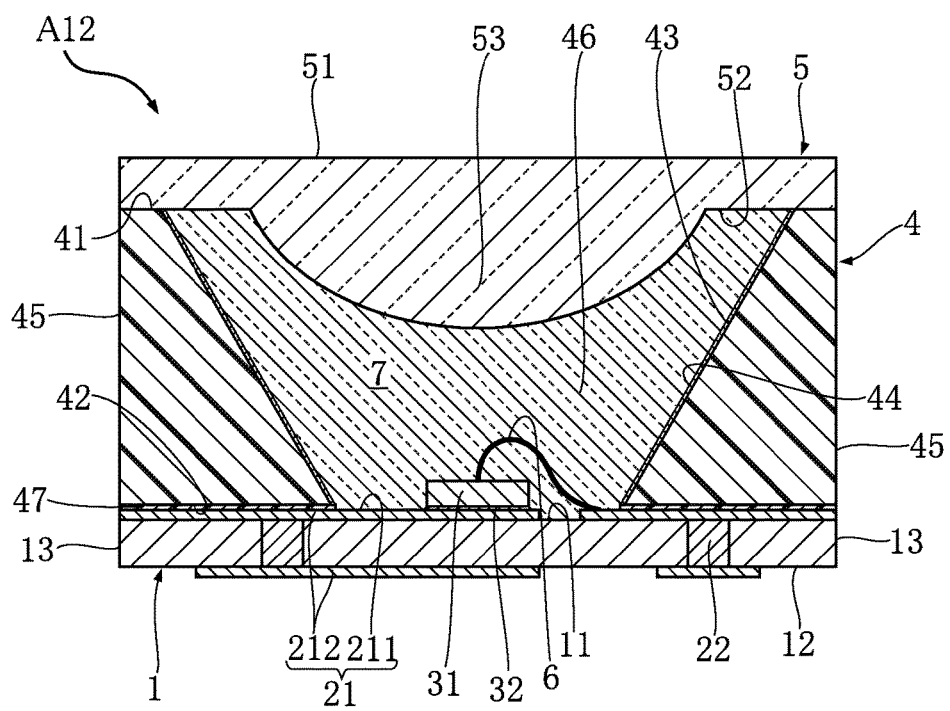
FIG. 7 is a cross-sectional view of an LED package according to a second modified example of the first embodiment of the present invention.

An LED package A12 according to a second modified example of the first embodiment of the present invention will be described with reference to FIG. 7. FIG. 7 is a cross-sectional view of the LED package A12, and the cross-sectional position thereof is the same as in FIG. 3.

The LED package A12 of this modified example is provided with the sealing resin 7 in contrast to the above-described LED package A10. In this modified example, the material of the sealing resin 7 is the same as that in the LED package A11. Therefore, the sealing resin 7 may be a synthetic resin containing a phosphor and configured to allow light to pass therethrough, similarly to the LED package A11. In this modified example, the entirety of the through area 46 is filled with the sealing resin 7. Note that the board 1 of the LED package A12 does not have the ventilation hole 15 formed therein, unlike the LED package A10.

Figure 8:
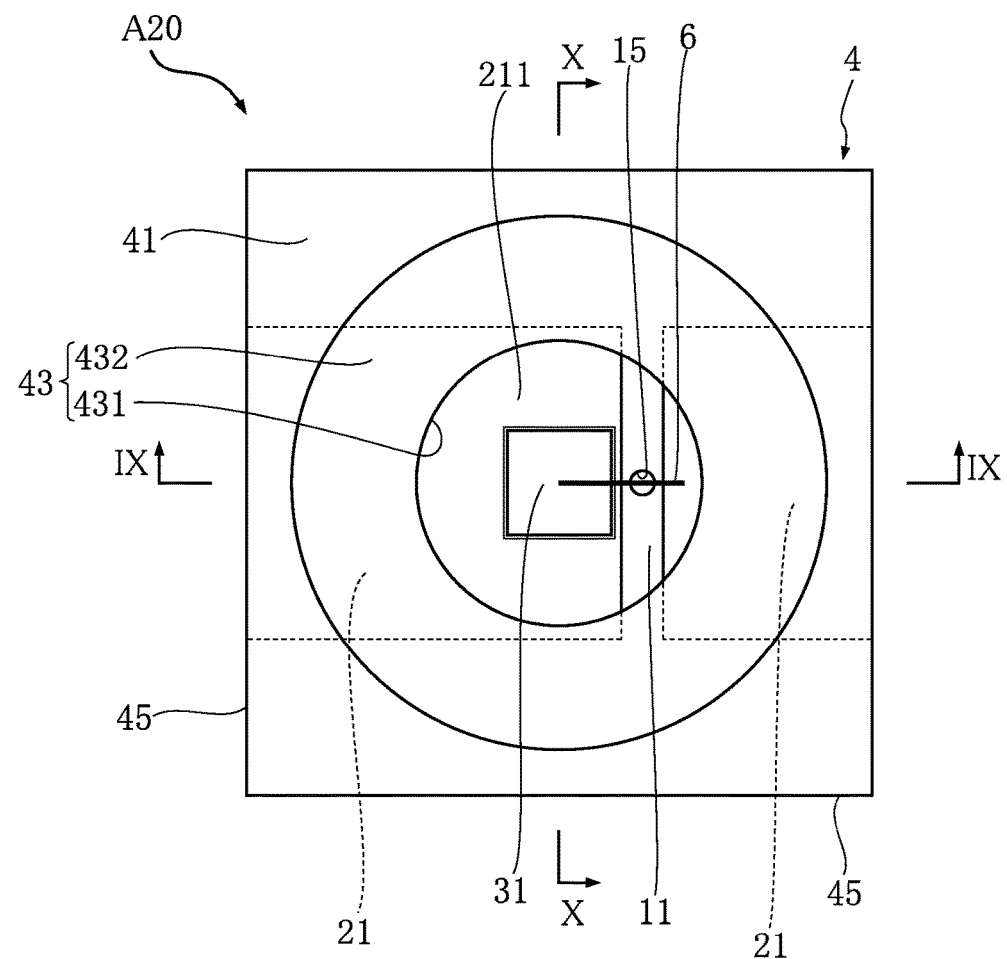
FIG. 8 is a plan view of an LED package according to a second embodiment of the present invention (a lid is omitted).
Figure 9:
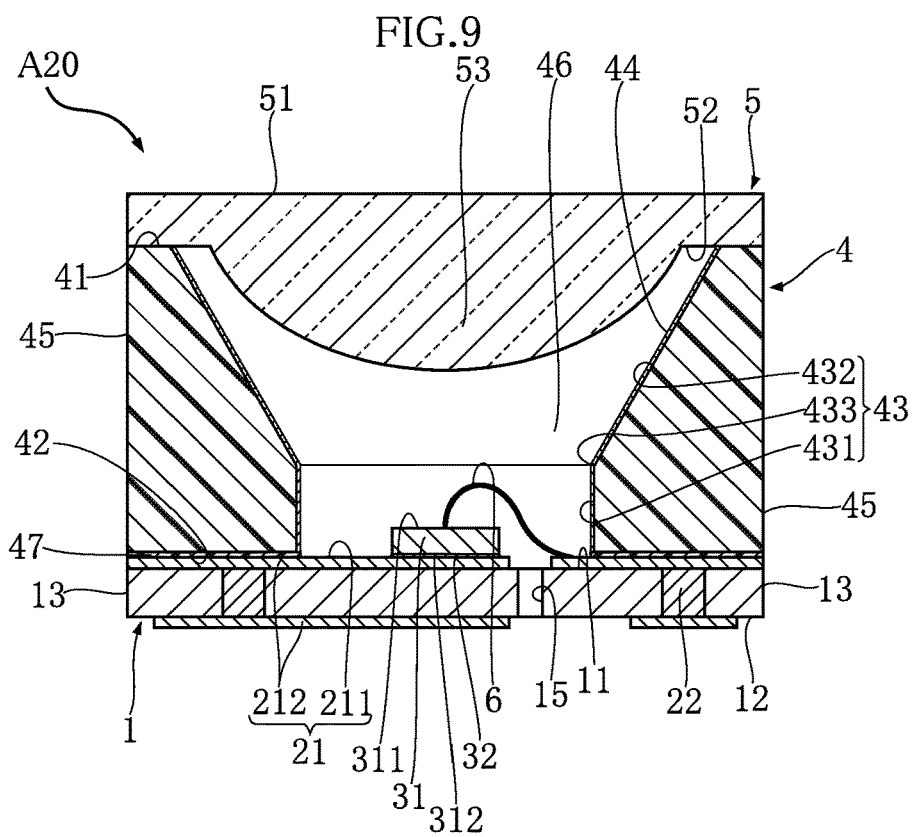
FIG. 9 is a cross-sectional view taken along a line IX-IX in FIG. 8.
Figure 10:
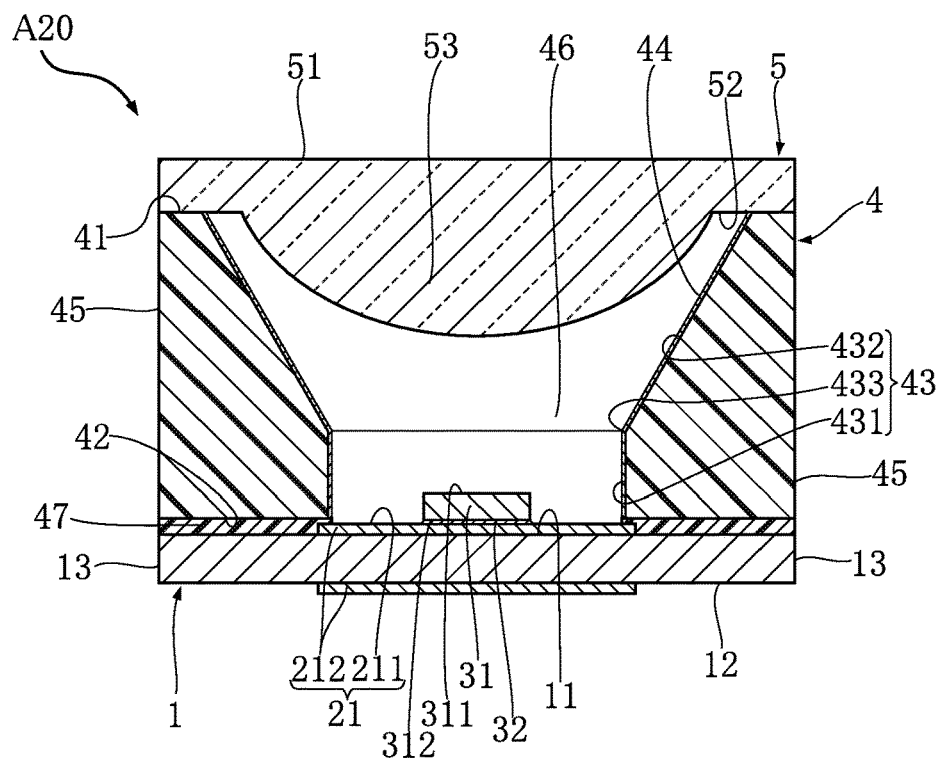
FIG. 10 is a cross-sectional view taken along a line X-X in FIG. 8.

According to this modified example, it is also possible to increase the light extraction efficiency while achieving a reduction in the height and size of the LED package A12. In this modified example, the entirety of the through area 46 is filled with the sealing resin 7 that covers the LED element 31. In this instance, light emitted from the LED element 31 will propagates through the sealing resin 7 and be directly incident to the lens portion 53, and thus a phenomenon of light refracting at the boundary between the sealing resin 7 and the air does not occur, unlike the instance of the LED package A11. Therefore, the LED package A12 makes it possible to further increase the light extraction efficiency compared to the LED package A11. —Second Embodiment An LED package A20 according to a second embodiment of the present invention will be described with reference to FIGS. 8 to 10. FIG. 8 is a plan view of the LED package A20, and the lid 5 is omitted for convenience of understanding. FIG. 9 is a cross-sectional view taken along a line IX-IX in FIG. 8. FIG. 10 is a cross-sectional view taken along a line X-X in FIG. 8. Note that in FIGS. 9 and 10, the lid 5 is illustrated and not omitted. In this embodiment, the LED package A20 is rectangular in plan view.

In the LED package A20 according to this embodiment, the planar view size of the board 1 and the configuration of the case 4 are different from those in the above-described LED package A10. As shown in FIG. 8, the planar view size of the board 1 is smaller than the planar view size of the board 1 of the LED package A10. Also, as shown in FIGS. 8 to 10, the reflective face 43 according to this embodiment includes a first reflective face 431 standing erect from the supporting face 42, and a second reflective face 432 that is joined to the end face 41 and the first reflective face 431, and that is inclined relative to the supporting face 42. Moreover, the planar view shape of a boundary portion 433 in which the first reflective face 431 and the second reflective face 432 intersect is circular. Therefore, the cross-sectional shape of the first reflective face 431 in the thickness direction of the case 4 is the same as the planar view shape of the boundary portion 433, and is uniform. Therefore, the through area 46 according to this embodiment is formed by a portion having a columnar shape formed by the supporting face 42, the first reflective face 431 and the boundary portion 433, and a portion having a truncated cone shape formed by the end face 41, the second reflective face 432 and the boundary portion 433.

In this embodiment, in the direction along the installation face 211, the distance from the center of the element obverse face 311 to the first reflective face 431 is the same as the distance from the center of the element obverse face 311 to the interface between the supporting face 42 and the reflective face 43 in the LED package A10. Also, in this embodiment, in the thickness direction of the board 1, the element obverse face 311 is positioned between the boundary portion 433 and the obverse face 11 of the board 1.

According to this embodiment, it also becomes possible to increase the light extraction efficiency while achieving a reduction in the height and size of the LED package A20. Moreover, the reflective face 43 according to this embodiment includes the first reflective face 431 standing erect from the supporting face 42 and the second reflective face 432 that is joined to the end face 41 and the first reflective face 431 and is inclined relative to the supporting face 42. With such a configuration, the planar view sizes of the board 1 and the case 4 can be smaller than that in the LED package A10. Therefore, the size of the LED package A20 can be further reduced compared to the LED package A10.

First Modified Example of Second Embodiment

Figure 11:
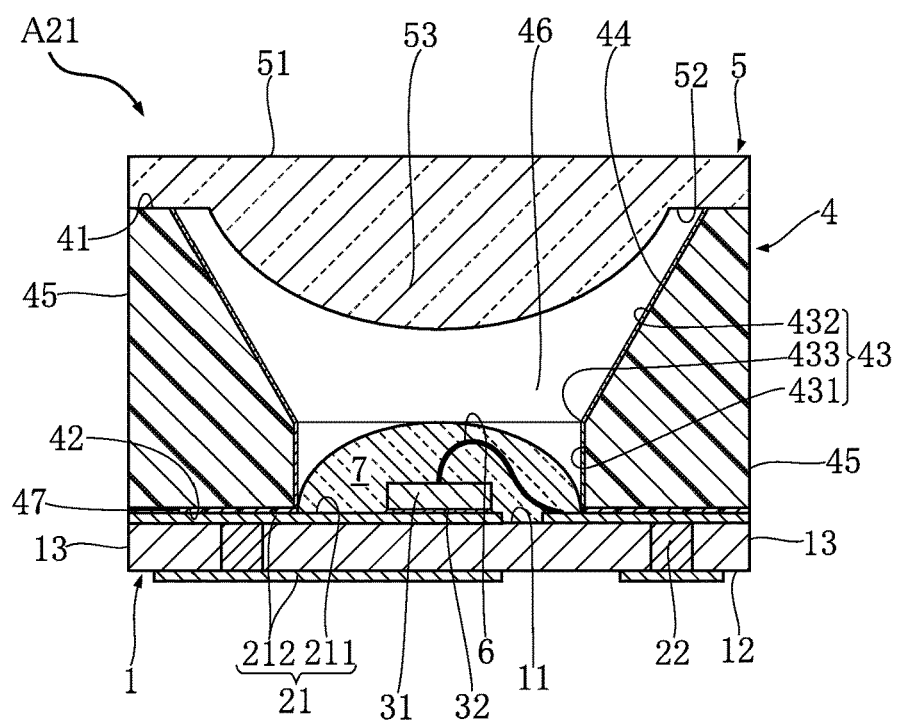
FIG. 11 is a cross-sectional view of an LED package according to a first modified example of the second embodiment of the present invention.

An LED package A21 according to a first modified example of the second embodiment of the present invention will be described with reference to FIG. 11. FIG. 11 is a cross-sectional view of the LED package A21, and the cross-sectional position thereof is the same as in FIG. 9.

The LED package A21 of this modified example is provided with the sealing resin 7 in contrast to the above-described LED package A20. The material, shape and the like of the sealing resin 7 are similar to those in the above-described LED package A11. Note that the board 1 of the LED package A21 does not have the ventilation hole 15 formed therein, unlike the LED package A20.

According to this modified example, it also becomes possible to increase the light extraction efficiency while achieving a reduction in the height and size of the LED package A21. Moreover, the LED package A21 is provided with the sealing resin 7 that fills a portion of the through area 46, and thereby actions and effects similar to those of the LED package A11 are obtained, and it becomes possible to further increase the light extraction efficiency compared to the LED package A20.

Second Modified Example of Second Embodiment

Figure 12:
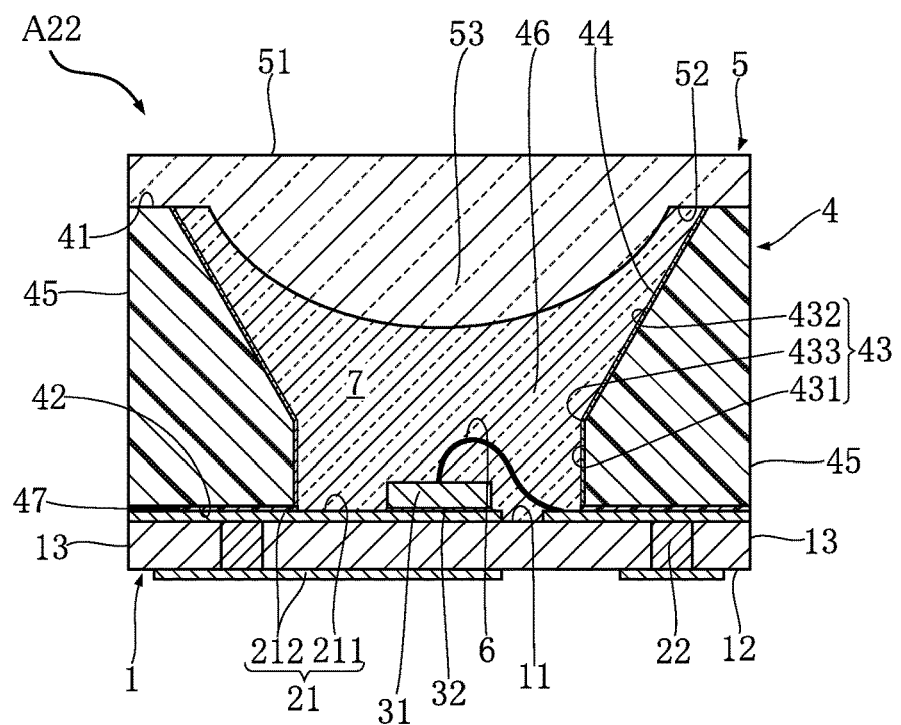
FIG. 12 is a cross-sectional view of an LED package according to a second modified example of the second embodiment of the present invention.

An LED package A22 according to a second modified example of the second embodiment of the present invention will be described with reference to FIG. 12. FIG. 12 is a cross-sectional view of the LED package A22, and the cross-sectional position thereof is the same as in FIG. 9.

The LED package A22 of this modified example is provided with the sealing resin 7 in contrast to the above-described LED package A20. The material, shape and the like of the sealing resin 7 are similar to those in the above-described LED package A12. Note that the board 1 of the LED package A22 does not have the ventilation hole 15 formed therein, unlike the LED package A20.

According to this modified example, it also becomes possible to increase the light extraction efficiency while achieving a reduction in the height and size of the LED package A22. Moreover, the LED package A22 is provided with the sealing resin 7 that fills the entirety of the through area 46, and thereby actions and effects similar to those of the LED package A12 are obtained, and it becomes possible to further increase the light extraction efficiency compared to the above-described LED package A21.

Third Embodiment

Figure 13:
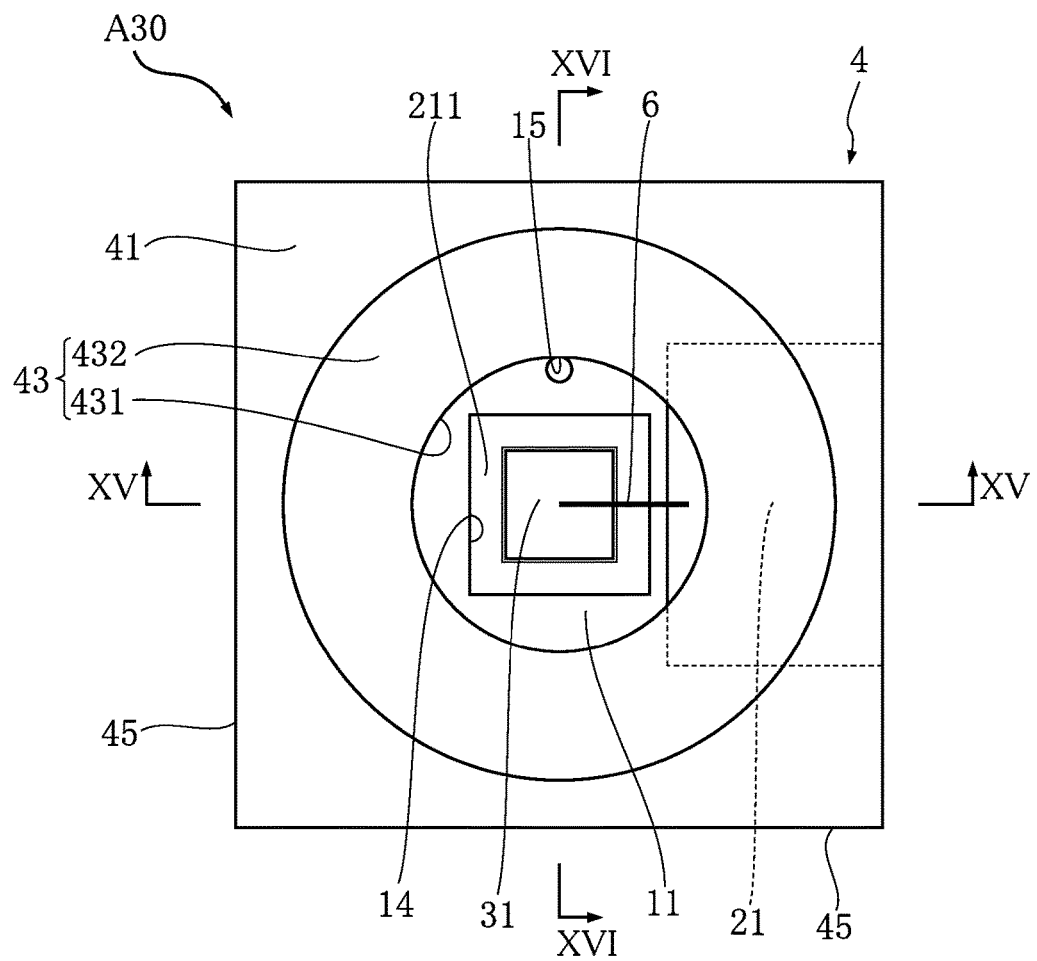
FIG. 13 is a plan view of an LED package according to a third embodiment of the present invention (a lid is omitted).
Figure 14:
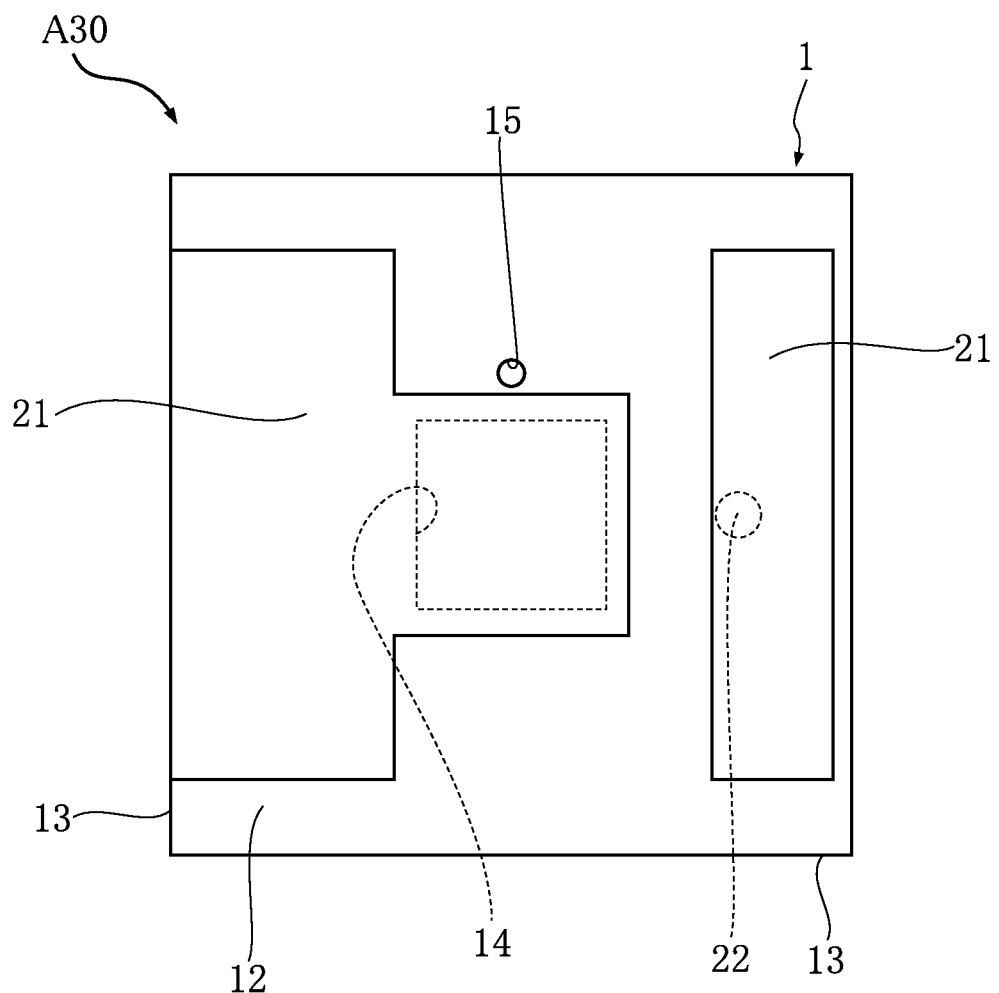
FIG. 14 is a bottom view of the LED package shown in FIG. 13.
Figure 15:
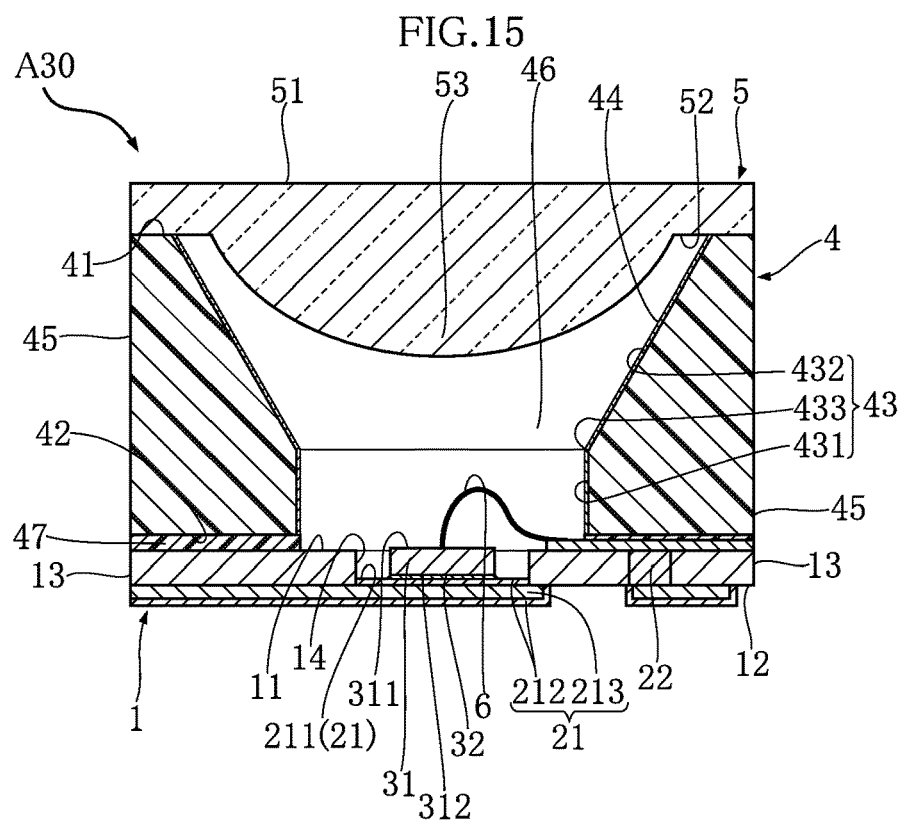
FIG. 15 is a cross-sectional view taken along a line XV-XV in FIG. 13.
Figure 16:
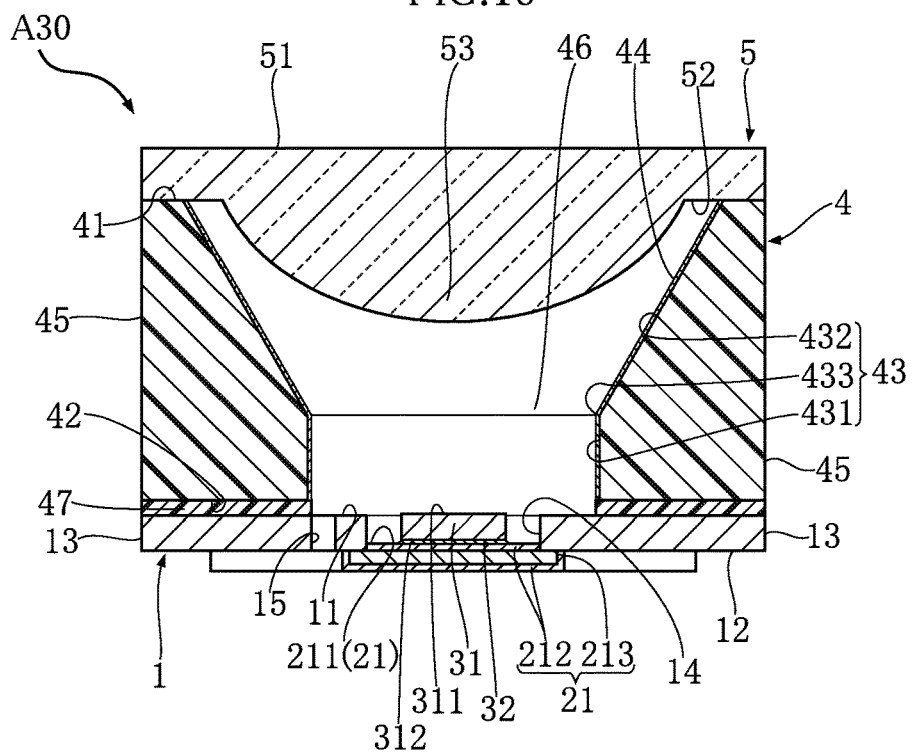
FIG. 16 is a cross-sectional view taken along a line XVI-XVI in FIG. 13.

An LED package A30 according to a third embodiment of the present invention will be described with reference to FIGS. 13 to 16. FIG. 13 is a plan view of the LED package A30, and for convenience of understanding, the lid 5 is omitted. FIG. 14 is a bottom view of the LED package A30. FIG. 15 is a cross-sectional view taken along a line XV-XV in FIG. 13. FIG. 16 is a cross-sectional view taken along a line XVI-XVI in FIG. 13. Note that in FIGS. 15 and 16, the lid 5 is illustrated and not omitted. In this embodiment, the LED package A30 is rectangular in plan view.

In the LED package A30 according to this embodiment, the configurations of the board 1, the conductive parts 21 and the case 4 are different from those in the above-described LED package A10. As shown in FIGS. 13, 15 and 16, the board 1 according to this embodiment has an opening portion 14 in addition to the obverse face 11, the mounting face 12 and the plurality of board side faces 13. The opening portion 14 is a portion depressed from the obverse face 11, and in this embodiment, passes through the board 1 from the obverse face 11 to the mounting face 12. The installation face 211 of the conductive parts 21 is exposed from the opening portion 14, and the LED element 31 is disposed on the installation face 211. Therefore, in this embodiment, a portion of the LED element 31 is accommodated in the opening portion 14.

As shown in FIGS. 14 to 16, the conductive part 21 according to this embodiment includes a metal foil 213 in addition to the plating layer 212. A portion of the metal foil 213 blocks the opening portion 14 from the mounting face 12 of the board 1, and the other portion is a portion in contact with the mounting face 12. Accordingly, the opening portion 14 is blocked by the metal foil 213 from the mounting face 12. The entirety of the metal foil 213 is covered by the plating layer 212. In this embodiment, the metal foil 213 is made of Cu. The metal foil 213 is fixed to the mounting face 12 using adhesive or the like. In this instance, only the conductive part 21 formed on the obverse face 11 is a part to which the bonding wire 6 shown on the right side of FIG. 13 is connected, and the communication conductive part 22 for bringing that part and the metal foil 213 formed on the mounting face 12 into electrical conduction with each other is formed in the board 1. The upper end of the communication conductive part 22 shown in FIG. 15 is in contact with the plating layer 212, and the lower end of the communication conductive part 22 shown in FIG. 15 is in contact with the metal foil 213.

Note that the configuration of the case 4 according to this embodiment is the same as that in the above-described LED package A20.

According to this embodiment, it also becomes possible to increase the light extraction efficiency while achieving a reduction in the height and size of the LED package A30. Moreover, according to this embodiment, the opening portion 14 is formed in the board 1, and the LED element 31 is disposed on the installation face 211 such that a portion of the LED element 31 is accommodated in the opening portion 14. With such a configuration, the vertical distance from the center of the element obverse face 311 to the lens portion 53 that is longer than that in the LED package A10 and the LED package A20 is ensured. In other words, a long focal distance from the light-emitting portion of the LED element 31 to the lens portion 53 is ensured, and thus the LED package A30 can further increase the light extraction efficiency compared to the LED package A10 and the LED package A20.

The configuration of the case 4 of the LED package A30 is the same as the configuration of the case 4 of the LED package A20, and thus the size of the LED package A30 can be made about the same as the size of the LED package A20.

First Modified Example of Third Embodiment

Figure 17:
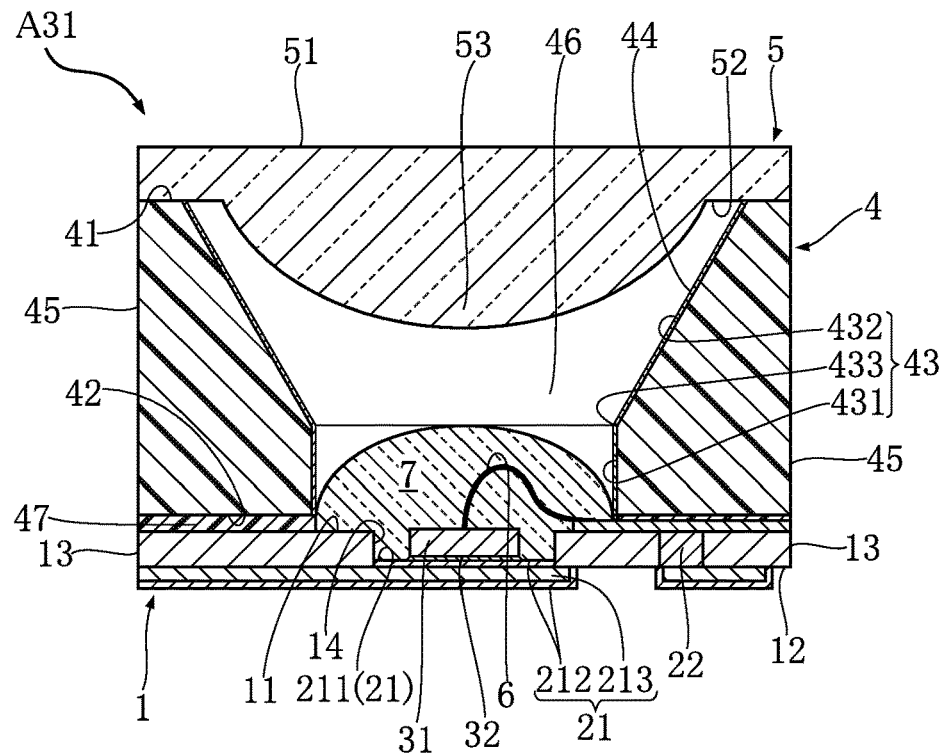
FIG. 17 is a cross-sectional view according to an LED package according to a first modified example of the third embodiment of the present invention.

An LED package A31 according to a first modified example of the third embodiment of the present invention will be described with reference to FIG. 17. FIG. 17 is a cross-sectional view of the LED package A31, and the cross-sectional position thereof is the same as in FIG. 15.

The LED package A31 of this modified example is provided with the sealing resin 7 in contrast to the above-described LED package A30. The material and shape of the sealing resin 7 are similar to those in the above-described LED package A11. In this instance, the entirety of the opening portion 14 is filled with the sealing resin 7. Note that the board 1 of the LED package A31 does not have the ventilation hole 15 formed therein, unlike the LED package A30.

According to this modified example, it also becomes possible to increase the light extraction efficiency while achieving a reduction in the height and size of the LED package A31. Moreover, the LED package A31 is provided with the sealing resin 7 that fills a portion of the through area 46, and thereby actions and effects similar to those of the LED package A11 are obtained, and it becomes possible to further increase the light extraction efficiency compared to the LED package A30.

Second Modified Example of Third Embodiment

Figure 18:
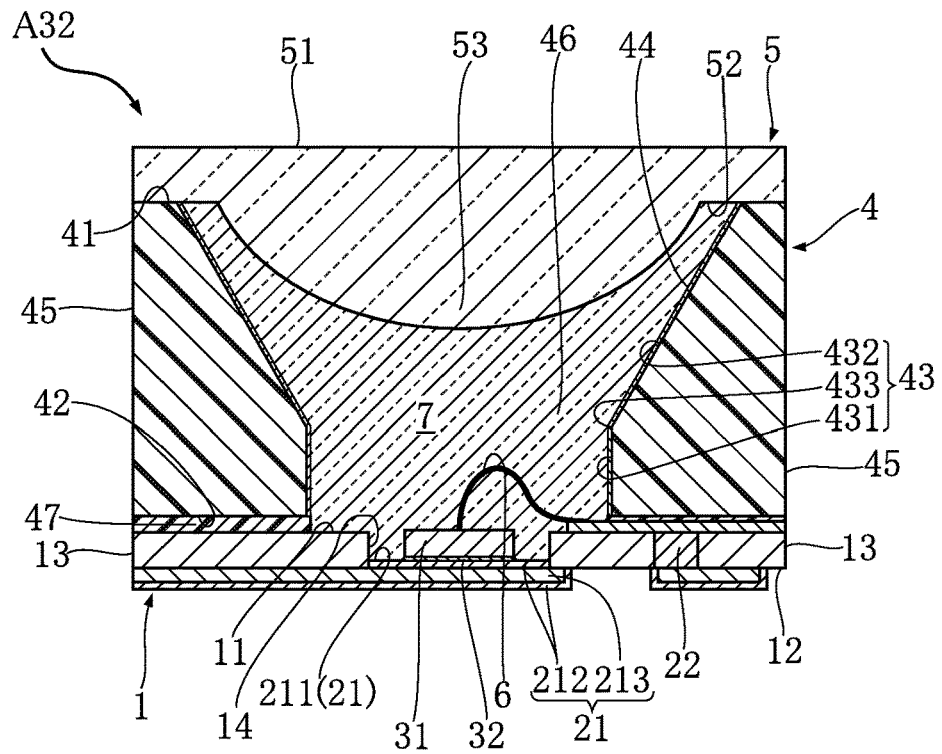
FIG. 18 is a cross-sectional view of an LED package according to a second modified example of the third embodiment of the present invention.

An LED package A32 according to a second modified example of the third embodiment of the present invention will be described with reference to FIG. 18. FIG. 18 is a cross-sectional view of the LED package A32, and the cross-sectional position thereof is the same as in FIG. 15.

The LED package A32 of this modified example is provided with the sealing resin 7 in contrast to the above-described LED package A30. The material of the sealing resin 7 is similar to that of the above-described LED package A12. In this instance, the entirety of the through area 46 and the opening portion 14 is filled with the sealing resin 7. Note that the board 1 of the LED package A32 does not have the ventilation hole 15 formed therein, unlike the LED package A30.

According to this modified example, it also becomes possible to increase the light extraction efficiency while achieving a reduction in the height and size of the LED package A32. Moreover, the LED package A32 is provided with the sealing resin 7 that fills the entirety of the through area 46 and the opening portion 14. Accordingly, the LED package A32 can obtain actions and effects similar to those of the LED package A12, and it becomes possible to further increase the light extraction efficiency compared to the above-described LED package A31.

Fourth Embodiment

Figure 19:
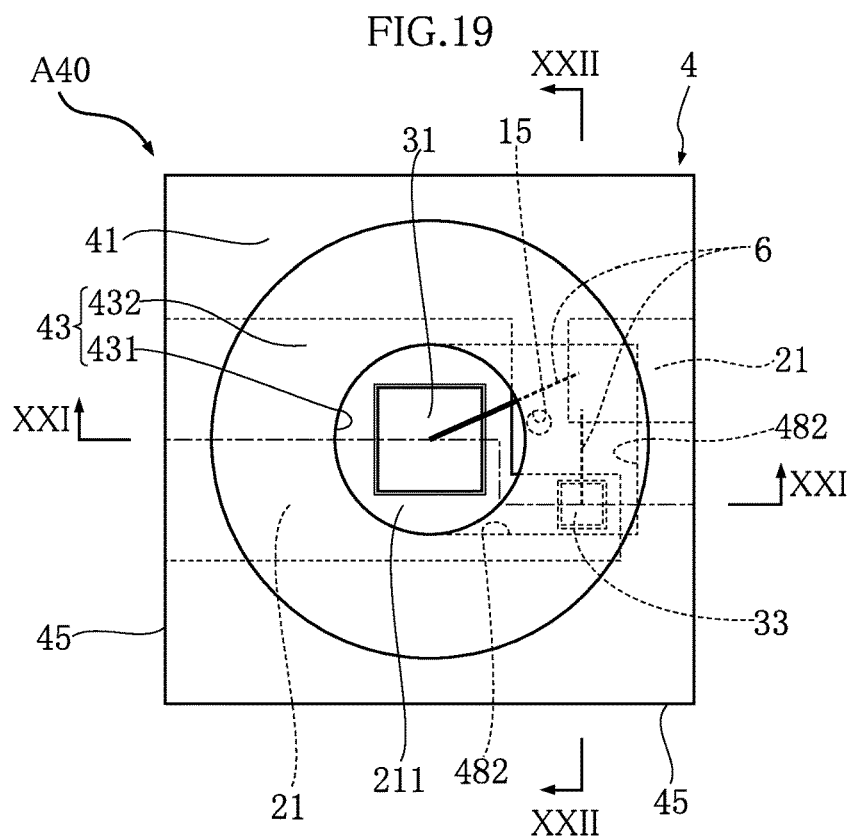
FIG. 19 is a plan view of an LED package according to a fourth embodiment of the present invention (a lid is omitted).
Figure 20:
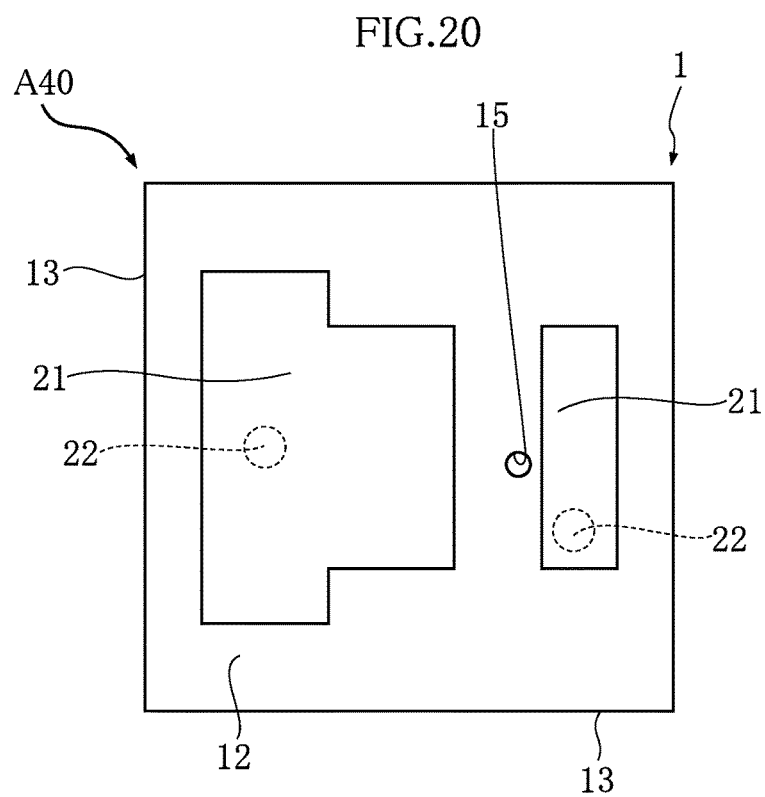
FIG. 20 is a bottom view of the LED package shown in FIG. 19.
Figure 21:
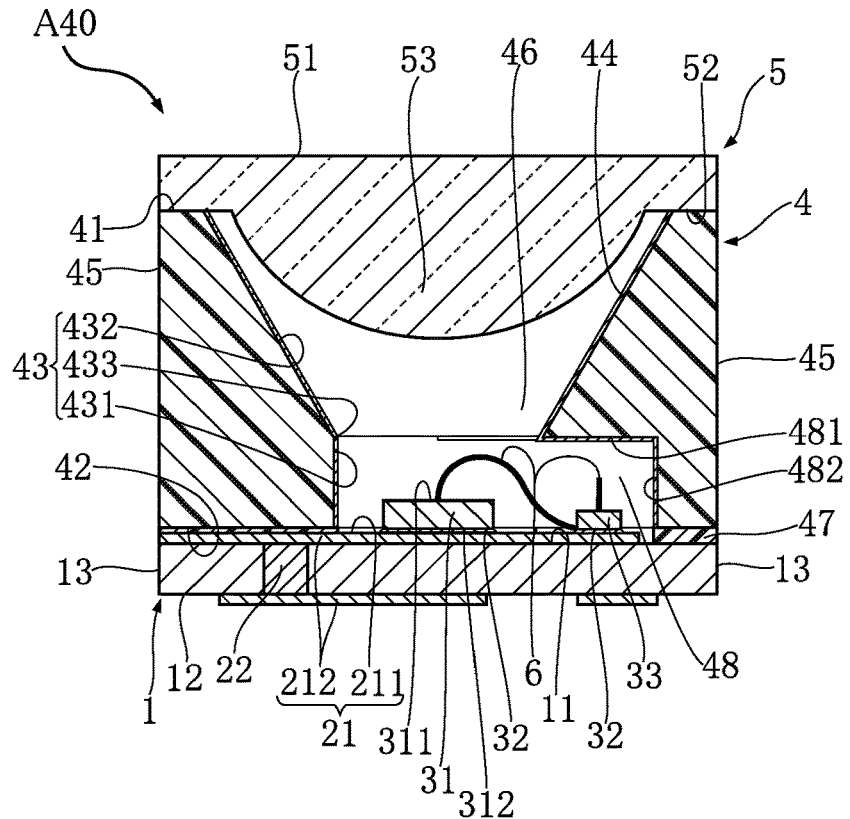
FIG. 21 is a cross-sectional view taken along a line XXI-XXI in FIG. 19.
Figure 22:
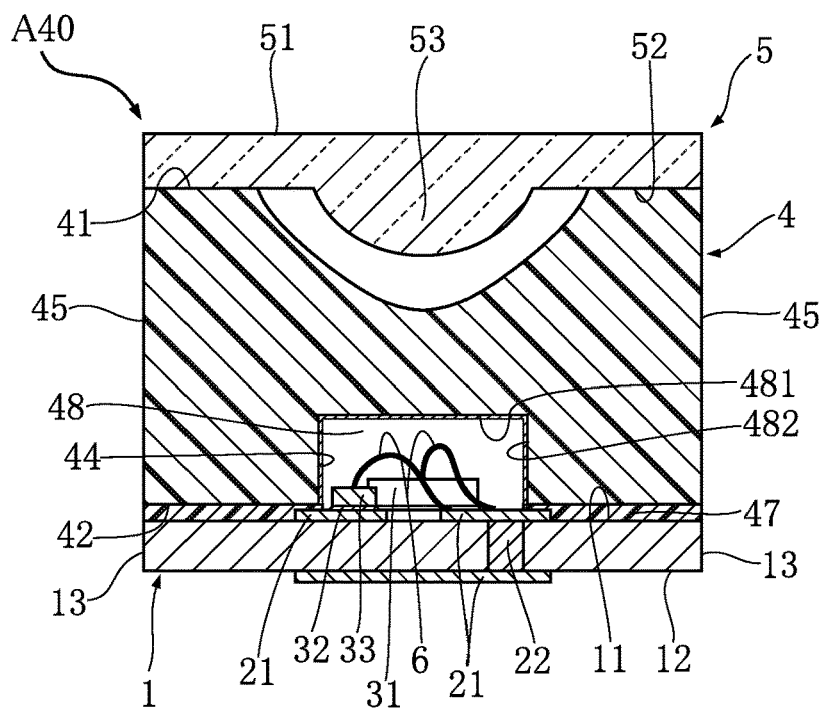
FIG. 22 is a cross-sectional view taken along a line XXII-XXII in FIG. 19.

An LED package A40 according to a fourth embodiment of the present invention will be described with reference to FIGS. 19 to 22. FIG. 19 is a plan view of the LED package A40, and for convenience of understanding, the lid 5 is omitted. FIG. 20 is a bottom view of the LED package A40. FIG. 21 is a cross-sectional view taken along a line XXI-XXI (a dashed-dotted line shown in FIG. 19) in FIG. 19. FIG. 22 is a cross-sectional view taken along a line XXII-XXII in FIG. 19. Note that in FIGS. 21 and 22, the lid 5 is illustrated and not omitted. In this embodiment, the LED package A40 is rectangular in plan view.

In the LED package A40 according to this embodiment, the planar view size of the board 1 and the configuration of the case 4 are different from those in the above-described LED package A10, and the LED package A40 is provided with a Zener diode 33 unlike the LED package A10. The planar view size of the board 1 is even smaller than the planar view sizes of the boards 1 of the LED package A10 and the above-described LED package A20.

As shown in FIGS. 21 and 22, the case 4 according to this embodiment is based on the case 4 of the LED package A20. Accordingly, the reflective face 43 of the case 4 has a configuration that includes the first reflective face 431 and the second reflective face 432. In addition, the case 4 according to this embodiment has an intermediate face 481 and internal faces 482. The intermediate face 481 is a flat face that forms a depression from the supporting face 42 toward the end face 41, and whose one edge is joined to the reflective face 43 (in this embodiment, the second reflective face 432). The intermediate face 481 is directed to the obverse face 11 of the board 1. The internal faces 482 are faces that stand erect from the supporting face 42 and that joins the intermediate face 481 and the supporting face 42 to each other. As shown in FIG. 19, the internal faces 482 according to this embodiment are smoothly joined to the first reflective face 431. Also, both the intermediate face 481 and the internal faces 482 are covered by the mirror surface plating layer 44.

As shown in FIGS. 19, 21 and 22, the case 4 according to this embodiment has a recess 48 that is a hollow area formed by the intermediate face 481, the internal faces 482 and the supporting face 42. The recess 48 leads to the through area 46. In this instance, a portion of the bonding wire 6 that connects the LED element 31 and the conductive part 21 is accommodated in the recess 48. In addition, in this embodiment, the Zener diode 33 disposed on the installation face 211 of the conductive part 21 and accommodated in the recess 48 is provided.

As shown in FIGS. 19 and 21, the Zener diode 33 is disposed on the installation face 211 of the conductive part 21 on which the LED element 31 is disposed. In addition, the LED package A40 is provided with the bonding wire 6 that connects the Zener diode 33 to the conductive part 21 on which the LED element 31 and the Zener diode 33 are not disposed. The entirety of the bonding wire 6 is accommodated in the recess 48 together with the Zener diode 33. In this embodiment, an n-side electrode (cathode) is formed on the upper face of the Zener diode 33 shown in FIGS. 21 and 22, and a p-side electrode (anode) is formed on the lower face of the Zener diode 33 shown in FIGS. 21 and 22. The n-side electrode is electrically connected, via the bonding wire 6, to the conductive part 21 on which the Zener diode 33 is not disposed. The p-side electrode is electrically connected, via the junction layer 32, to the conductive part 21 on which the Zener diode 33 is disposed. Accordingly, the Zener diode 33 is connected in parallel with the LED element 31. The junction layer 32 is applied in order to adhere the Zener diode 33 to the installation face 211 of the conductive part 21, similarly to the LED element 31.

Note that as shown in FIG. 20, the shapes of the conductive parts 21 formed on the mounting face 12 of the board 1 approximate the shapes of the conductive parts 21 in the LED package A10 shown in FIG. 2.

In addition, the case 4 according to this embodiment is based on the case 4 of the LED package A20, but may be based on the case 4 of the LED package A10. Moreover, the case 4 that is applied to the above-described LED package A30 may be applied instead of the case 4 according to this embodiment.

According to this embodiment, it also becomes possible to increase the light extraction efficiency while achieving a reduction in the height and size of the LED package A40. In addition, the case 4 according to this embodiment has the intermediate face 481 and the internal faces 482. In this instance, a portion of the bonding wire 6 that connects the LED element 31 to the conductive part 21 is accommodated in the recess 48 formed in the case 4 by the intermediate face 481, the internal faces 482 and the supporting face 42. With such a configuration, the planar view sizes of the board 1 and the case 4 can be further reduced compared to those in the LED package A20. Therefore, the size of the LED package A40 can be further reduced compared to the LED package A20.

In addition, in this embodiment, the Zener diode 33 that is disposed on the installation face 211 of the conductive part 21 and is accommodated in the recess 48 is provided. The Zener diode 33 is connected in parallel with the LED element 31. Such a circuit is configured in the LED package A40, and thereby, for example, if static electricity in the opposite direction to the LED package A40 is discharged, the static electricity flows through the Zener diode 33, and does not flow through the LED element 31. Moreover, if static electricity in the forward direction to the LED package A40 is discharged, a voltage that is applied to the LED element 31 will always be less than a certain value. Therefore, even if static electricity in the forward direction and reverse direction to the LED package A40 is discharged, it is possible to prevent that static electricity from damaging the LED element 31. In addition, it is possible to prevent an excessive voltage in the forward direction from being applied to the LED element 31. Moreover, the Zener diode 33 is accommodated in the recess 48, and thus the space of the recess 48 can be effectively used.

First Modified Example of Fourth Embodiment

Figure 23:
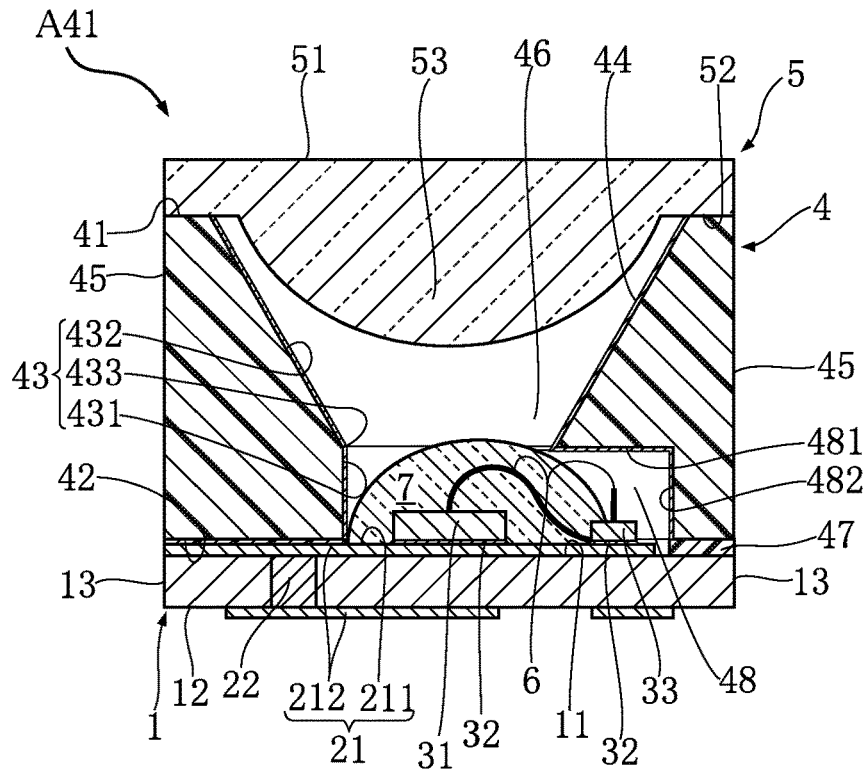
FIG. 23 is a cross-sectional view of an LED package according to a first modified example of the fourth embodiment of the present invention.

An LED package A41 according to a first modified example of the fourth embodiment of the present invention will be described with reference to FIG. 23. FIG. 23 is a cross-sectional view of the LED package A41, and the cross-sectional position thereof is the same as in FIG. 21.

The LED package A41 of this modified example is provided with the sealing resin 7, in contrast to the above-described LED package A40. The material, shape and the like of the sealing resin 7 are similar to those in the above-described LED package A11. In this case, a portion of the recess 48 is filled with the sealing resin 7. Note that the entirety of the recess 48 may be filled with the sealing resin 7. Note that the board 1 of the LED package A41 does not have the ventilation hole 15 formed therein, unlike the LED package A40.

According to this modified example, it also becomes possible to increase the light extraction efficiency while achieving a reduction in the height and size of the LED package A41. Moreover, the LED package A41 is provided with the sealing resin 7 that fills a portion of the through area 46, and thereby actions and effects similar to those of the LED package A11 are obtained, and it becomes possible to further increase the light extraction efficiency compared to the LED package A40.

Second Modified Example of Fourth Embodiment

Figure 24:
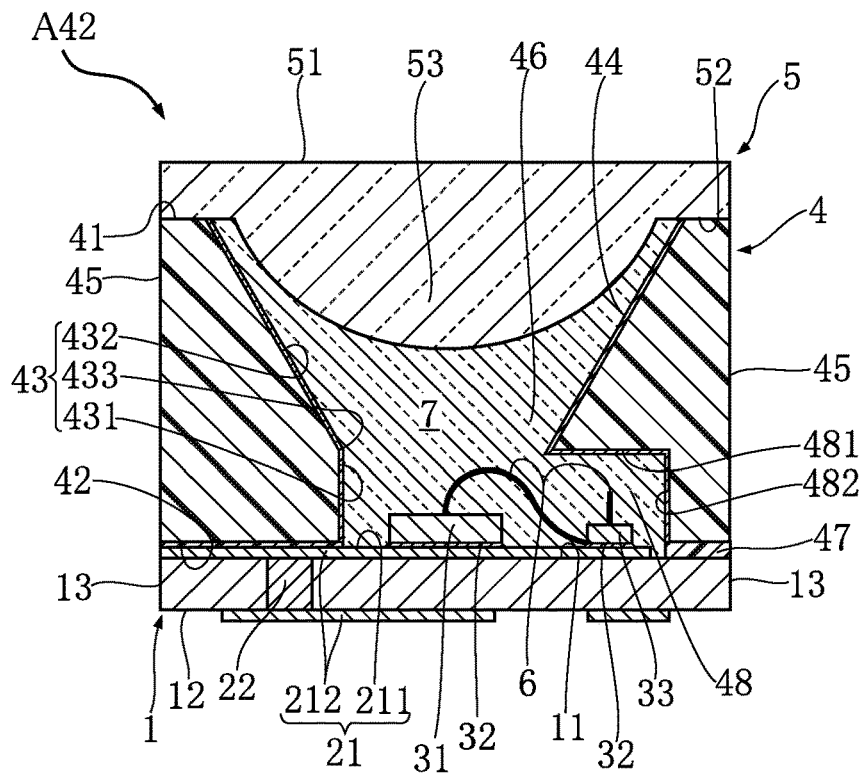
FIG. 24 is a cross-sectional view of an LED package according to a second modified example of the fourth embodiment of the present invention.

An LED package A42 according to a second modified example of the fourth embodiment of the present invention will be described with reference to FIG. 24. FIG. 24 is a cross-sectional view of the LED package A42, and the cross-sectional position thereof is the same as in FIG. 21. The LED package A42 of this modified example is provided with the sealing resin 7 in contrast to the above-described LED package A40. The material, shape and the like of the sealing resin 7 are similar to those in the above-described LED package A12. In this case, the entirety of the recess 48 is filled with the sealing resin 7. Note that the board 1 of the LED package A42 does not have the ventilation hole 15 formed therein, unlike the LED package A40.

According to this modified example, it also becomes possible to increase the light extraction efficiency while achieving a reduction in the height and size of the LED package A42. Moreover, the LED package A42 is provided with the sealing resin 7 that fills the entirety of the through area 46, and thereby actions and effects similar to those of the LED package A12 are obtained, and it becomes possible to further increase the light extraction efficiency compared to the above-described LED package A41.

Fifth Embodiment

Figure 25:
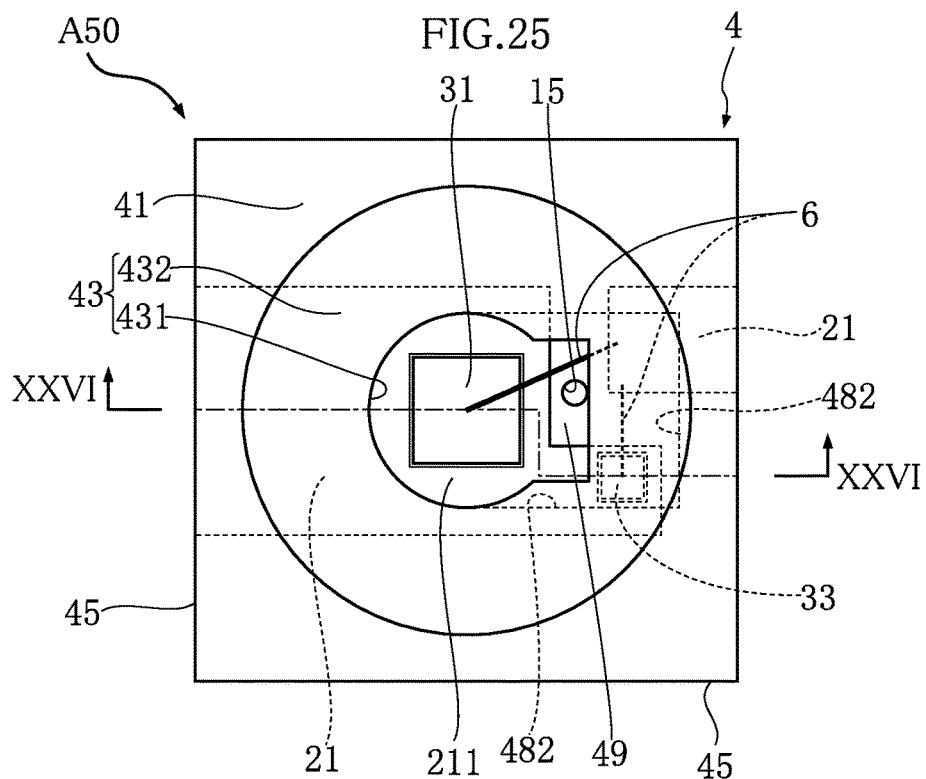
FIG. 25 is a plan view of an LED package according to a fifth embodiment of the present invention (a lid is omitted).
Figure 26:
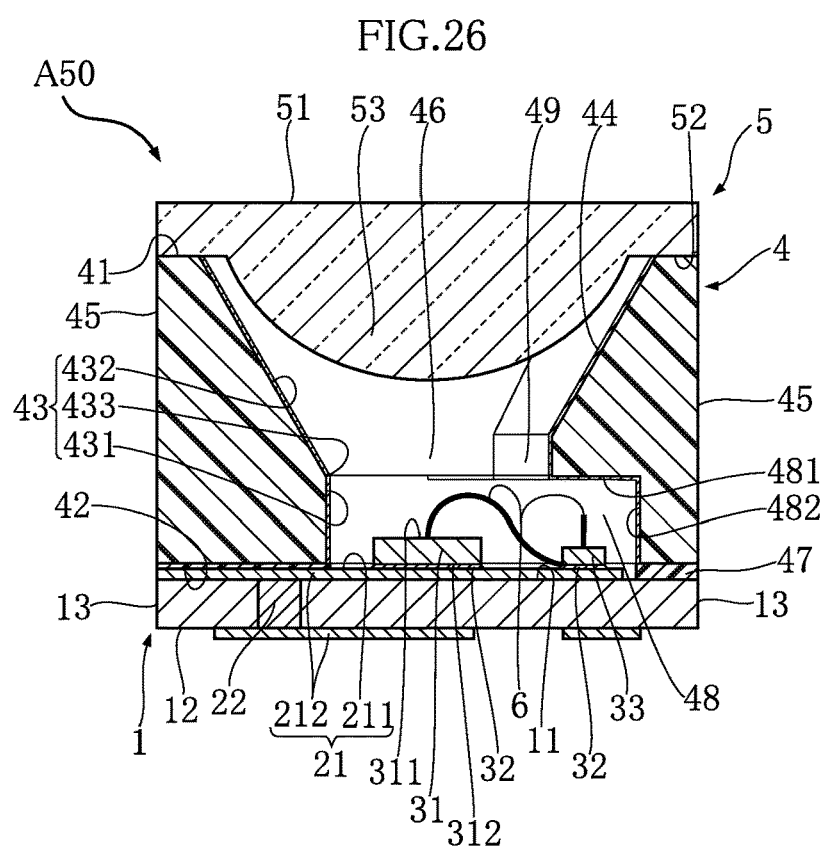
FIG. 26 is a cross-sectional view taken along a line XXVI-XXVI in FIG. 25.

An LED package A50 according to a fifth embodiment of the present invention will be described with reference to FIGS. 25 and 26. FIG. 25 is a plan view of the LED package A50, and for convenience of understanding, the lid 5 is omitted. FIG. 26 is a cross-sectional view taken along a line XXVI-XXVI (a dashed-dotted line) in FIG. 25. Note that in FIG. 26, the lid 5 is illustrated and not omitted. In this embodiment, the LED package A50 is rectangular in plan view.

In the LED package A50 according to this embodiment, the configuration of the case 4 is different from that in the above-described LED package A40. Note that the planar view size of the board 1 is assumed to be the same as that in the LED package A40.

As shown in FIGS. 25 and 26, the case 4 according to this embodiment is based on the LED package A40. Moreover, the case 4 according to this embodiment has a notch portion 49 formed therein. The notch portion 49 is a space that is interposed between the through area 46 and the recess 48, and appears by removing a portion of each of the intermediate face 481 and the reflective face 43 (in this embodiment, the second reflective face 432) joined to the intermediate face 481. The bonding wire 6 that connects the LED element 31 and the conductive part 21 passes through the notch portion 49.

According to this embodiment, it also becomes possible to increase the light extraction efficiency while achieving a reduction in the height and size of the LED package A50. Moreover, the case 4 according to this embodiment has the notch portion 49 formed therein, and the bonding wire 6 that connects the LED element 31 to the conductive part 21 passes through the notch portion 49. When the case 4 having the recess 48 formed therein such as that of the LED package A40 is arranged on the board 1, there is a possibility that, depending on the shape of the bonding wire 6 that connects the LED element 31 to the conductive part 21, this bonding wire 6 comes into contact with the intermediate face 481 and is damaged. In view of this, it is possible to prevent the bonding wire 6 that connects the LED element 31 and the conductive part 21 from coming into contact with the intermediate face 481 and being damaged by forming the notch portion 49 on the case 4.

First Modified Example of Fifth Embodiment

Figure 27:
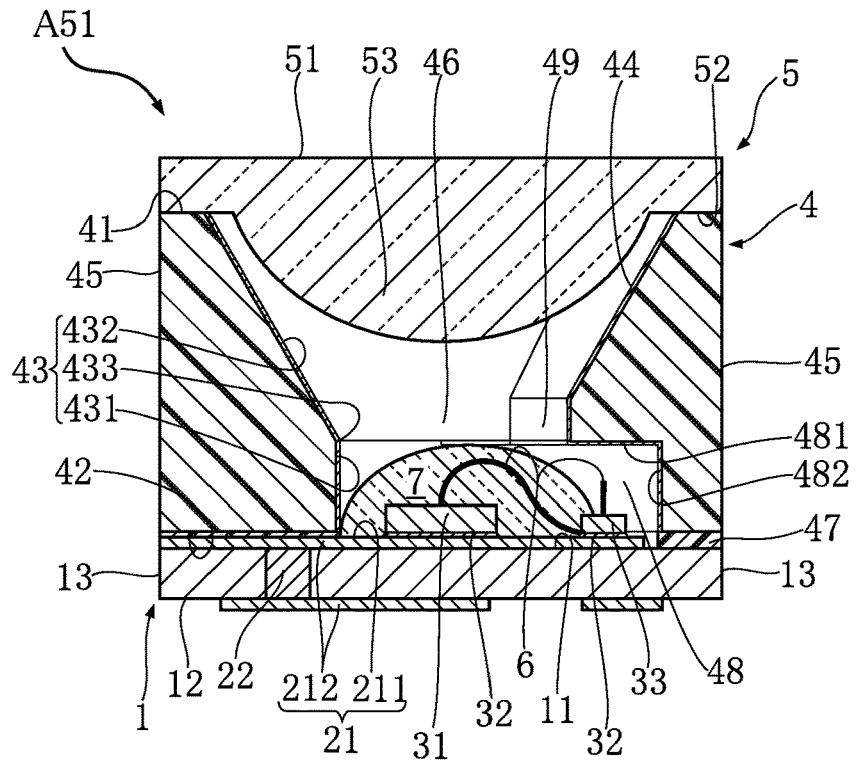
FIG. 27 is a cross-sectional view of an LED package according to a first modified example of the fifth embodiment of the present invention.

An LED package A51 according to a first modified example of the fifth embodiment of the present invention will be described with reference to FIG. 27. FIG. 27 is a cross-sectional view of the LED package A51, and the cross-sectional position thereof is the same as in FIG. 26.

The LED package A51 of this modified example is provided with the sealing resin 7 in contrast to the above-described LED package A50. The material, shape and the like of the sealing resin 7 are similar to those in the above-described LED package A11. In this case, a portion of each of the recess 48 and the notch portion 49 is filled with the sealing resin 7. Note that the entirety of the recess 48 may be filled with the sealing resin 7. Note that the board 1 of the LED package A51 does not have the ventilation hole 15 formed therein, unlike the LED package A50.

According to this modified example, it also becomes possible to increase the light extraction efficiency while achieving a reduction in the height and size of the LED package A51. Moreover, the LED package A51 is provided with the sealing resin 7 that fills a portion of the through area 46, and thereby actions and effects similar to those of the LED package A11 are obtained, and it becomes possible to further increase the light extraction efficiency compared to the LED package A50.

Second Modified Example of Fifth Embodiment

Figure 28:
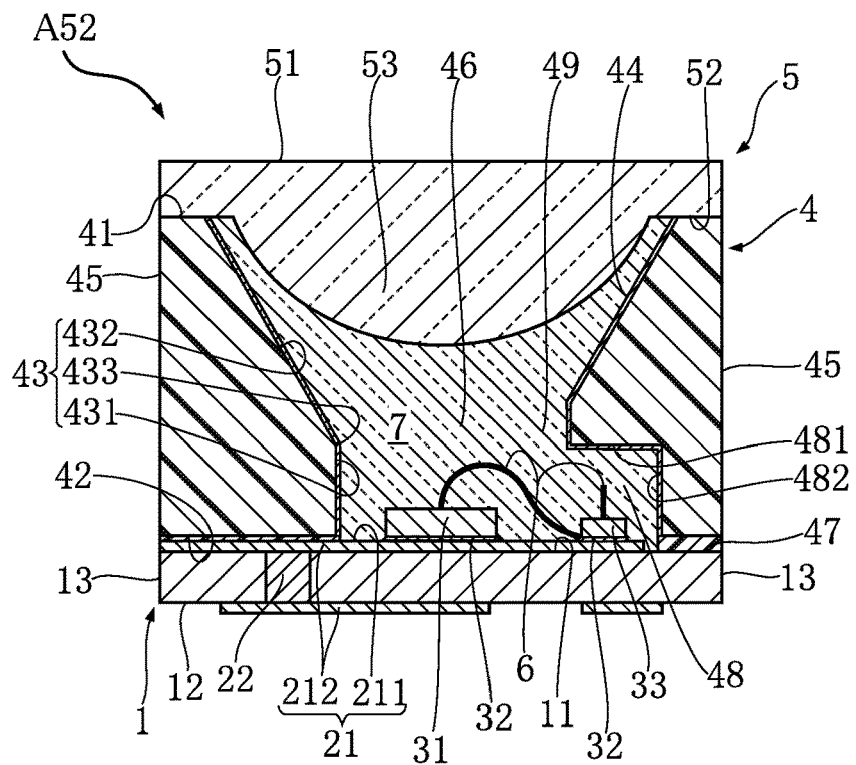
FIG. 28 is a cross-sectional view of an LED package according to a second modified example of the fifth embodiment of the present invention.

An LED package A52 according to a second modified example of the fifth embodiment of the present invention will be described with reference to FIG. 28. FIG. 28 is a cross-sectional view of the LED package A52, and the cross-sectional position thereof is the same as in FIG. 26.

The LED package A52 of this modified example is provided with the sealing resin 7 in contrast to the above-described LED package A50. The material, shape and the like of the sealing resin 7 are similar to those in the above-described LED package A12. In this case, the entirety of the recess 48 and the notch portion 49 is filled with the sealing resin 7. Note that the board 1 of the LED package A52 does not have the ventilation hole 15 formed therein, unlike the LED package A50.

According to this modified example, it also becomes possible to increase the light extraction efficiency while achieving a reduction in the height and size of the LED package A52. Moreover, the LED package A52 is provided with the sealing resin 7 that fills the entirety of the through area 46, and thereby actions and effects similar to those of the LED package A12 are obtained, and it becomes possible to further increase the light extraction efficiency compared to the above-described LED package A51.

Sixth Embodiment

Figure 29:
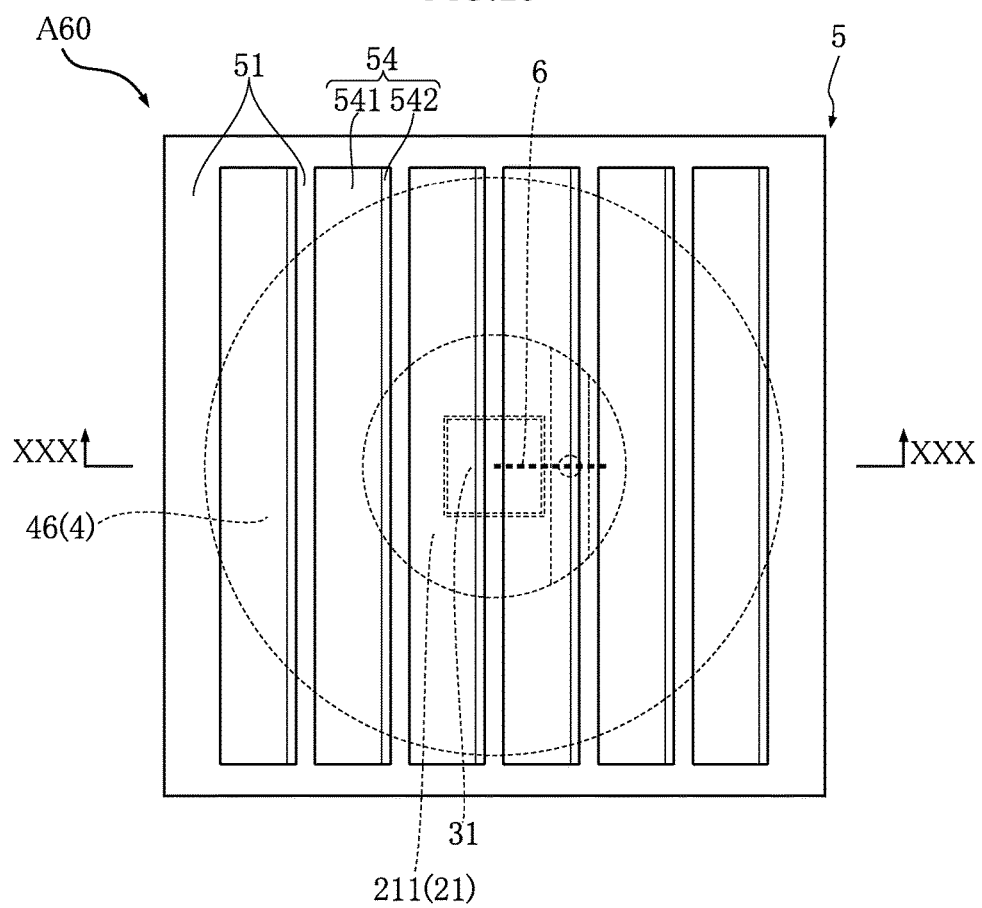
FIG. 29 is a plan view of an LED package according to a sixth embodiment of the present invention.
Figure 30:
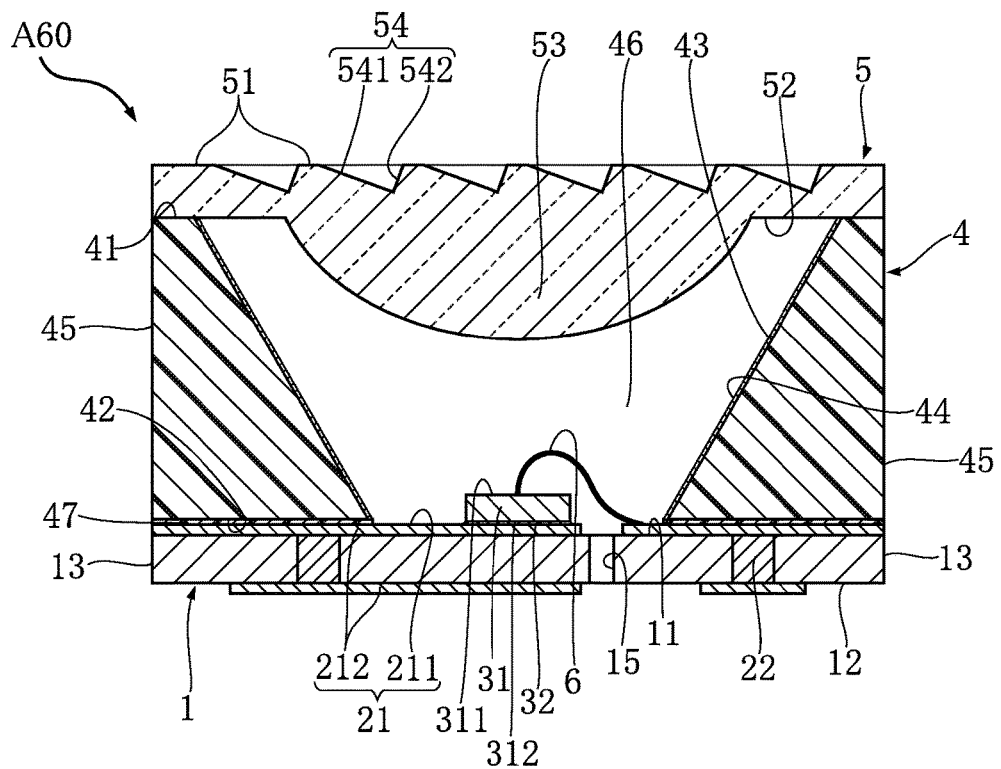
FIG. 30 is a cross-sectional view taken along a line XXX-XXX in FIG. 29.
Figure 31:
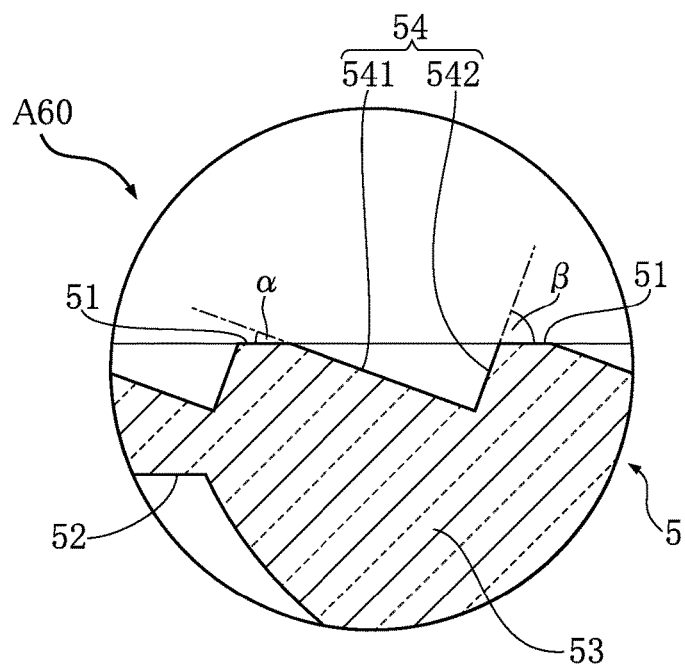
FIG. 31 is a partial enlarged view of FIG. 30.

An LED package A60 according to a sixth embodiment of the present invention will be described with reference to FIGS. 29 to 31. FIG. 29 is a plan view of the LED package A60. FIG. 30 is a cross-sectional view taken along a line XXX-XXX in FIG. 29. FIG. 31 is a partial enlarged view of FIG. 30. In this embodiment, the LED package A60 is rectangular in plan view.

In the LED package A60 according to this embodiment, the configuration of the lid 5 is different from that of the above-described LED package A10.

As shown in FIGS. 29 and 30, prism portions 54 are formed on the lid 5 according to this embodiment. The prism portions 54 have a first inclined face 541 and a second inclined face 542 each of which is inclined relative to the top face 51 of the lid 5. As shown in FIG. 31, one edge of each of the first inclined face 541 and the second inclined face 542 is joined to the top face 51, and the opposite edges of the first inclined face 541 and the second inclined face 542 are joined to each other. Also, an acute angle α formed by the top face 51 and the first inclined face 541 is smaller than an acute angle β formed by the top face 51 and the second inclined face 542. As shown in FIG. 29, the prism portions 54 extend in one direction in plan view. Also, a portion of the through area 46 of the case 4 overlaps with the prism portions 54. A plurality of prism portions 54 according to this embodiment are formed on the lid 5 in a state of being separated from each other. Each of all of the prism portions 54 is individually enclosed by the top face 51 of the lid 5. Accordingly, the shape of the top face 51 according to this embodiment is a frame shape having a plurality of slits each formed by an area occupied by the prism portion 54.

The LED package A60 according to this embodiment is obtained by changing the configuration of the lid 5 of the LED package A10. The lid 5 according to this embodiment can be applied to any of the LED packages A20, A30, A40 and A50.

According to this embodiment, it also becomes possible to increase the light extraction efficiency while achieving a reduction in the height and size of the LED package A60. Moreover, on the lid 5 according to this embodiment, the prism portions 54 having the first inclined face 541 and the second inclined face 542 are formed, one edge of each of the first inclined face 541 and the second inclined face 542 being joined to the top face 51. In this case, the acute angle α formed by the top face 51 and the first inclined face 541 is smaller than the acute angle β formed by the top face 51 and the second inclined face 542. With such a configuration, light that is emitted from the LED element 31 and passes through the lid 5 is refracted by the first inclined face 541 in a certain direction. Therefore, the light emitted from the LED package A60 can be polarized in a predetermined direction.

First Modified Example of Sixth Embodiment

Figure 32:
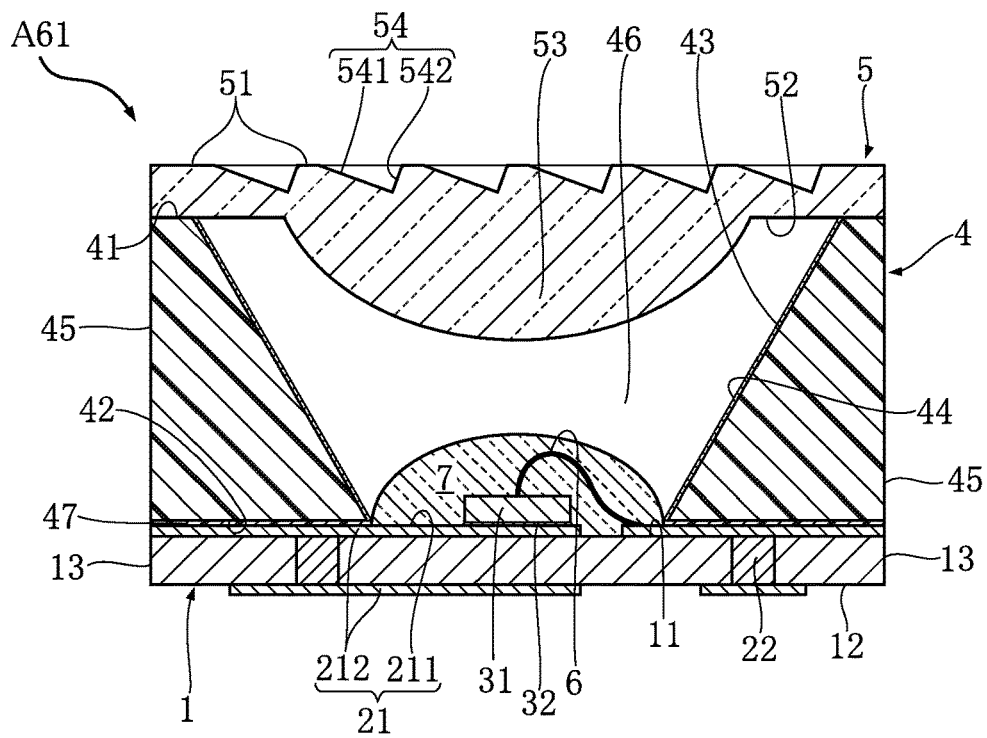
FIG. 32 is a cross-sectional view of an LED package according to a first modified example of the sixth embodiment of the present invention.

An LED package A61 according to a first modified example of the sixth embodiment of the present invention will be described with reference to FIG. 32. FIG. 32 is a cross-sectional view of the LED package A61, and the cross-sectional position thereof is the same as in FIG. 30.

The LED package A61 of this modified example is provided with the sealing resin 7 in contrast to the above-described LED package A60. The material, shape and the like of the sealing resin 7 are similar to those in the above-described LED package A11. Note that the board 1 of the LED package A61 does not have the ventilation hole 15 formed therein, unlike the LED package A60.

According to this modified example, it also becomes possible to increase the light extraction efficiency while achieving a reduction in the height and size of the LED package A61. Moreover, the LED package A61 is provided with the sealing resin 7 that fills a portion of the through area 46, and thereby actions and effects similar to those of the LED package A11 are obtained, and it becomes possible to further increase the light extraction efficiency compared to the LED package A60.

Second Modified Example of Sixth Embodiment

Figure 33:
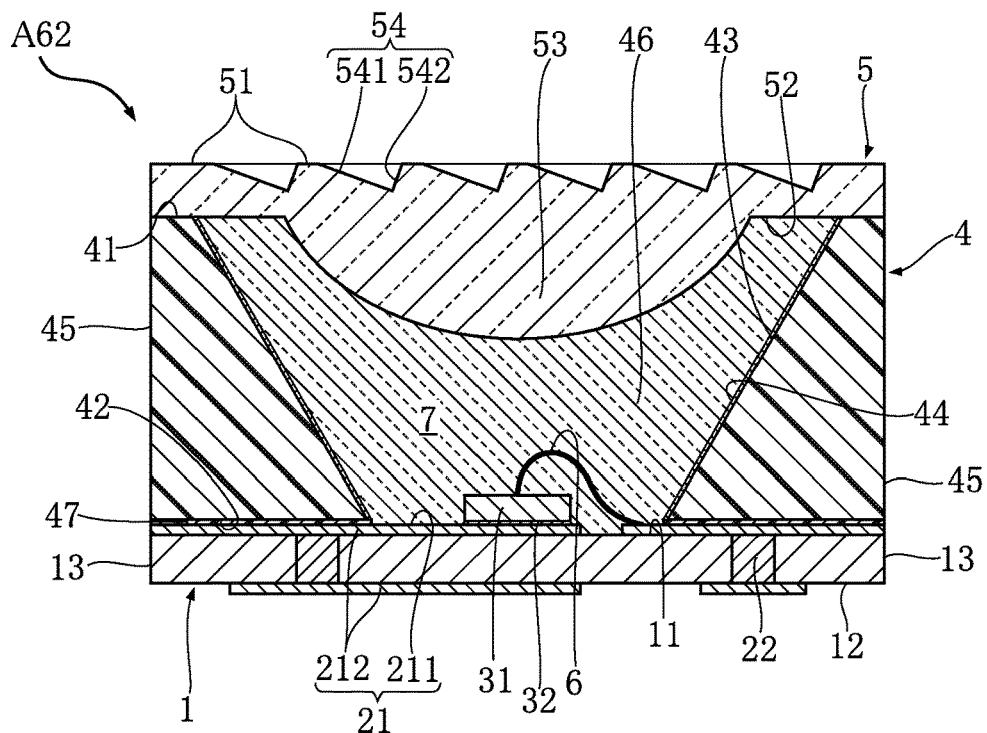
FIG. 33 is a cross-sectional view of an LED package according to a second modified example of the sixth embodiment of the present invention.

An LED package A62 according to a second modified example of the sixth embodiment of the present invention will be described with reference to FIG. 33. FIG. 33 is a cross-sectional view of the LED package A62, and the cross-sectional position thereof is the same as in FIG. 30.

The LED package A62 of this modified example is provided with the sealing resin 7 in contrast to the above-described LED package A60. The material, shape and the like of the sealing resin 7 are similar to those in the above-described LED package A12. Note that the board 1 of the LED package A62 does not have the ventilation hole 15 formed therein, unlike the LED package A60.

According to this modified example, it also becomes possible to increase the light extraction efficiency while achieving a reduction in the height and size of the LED package A62. Moreover, the LED package A62 is provided with the sealing resin 7 that fills the entirety of the through area 46, and thereby actions and effects similar to those of the LED package A12 are obtained, and it becomes possible to further increase the light extraction efficiency compared to the above-described LED package A61.

Seventh Embodiment

Figure 34:
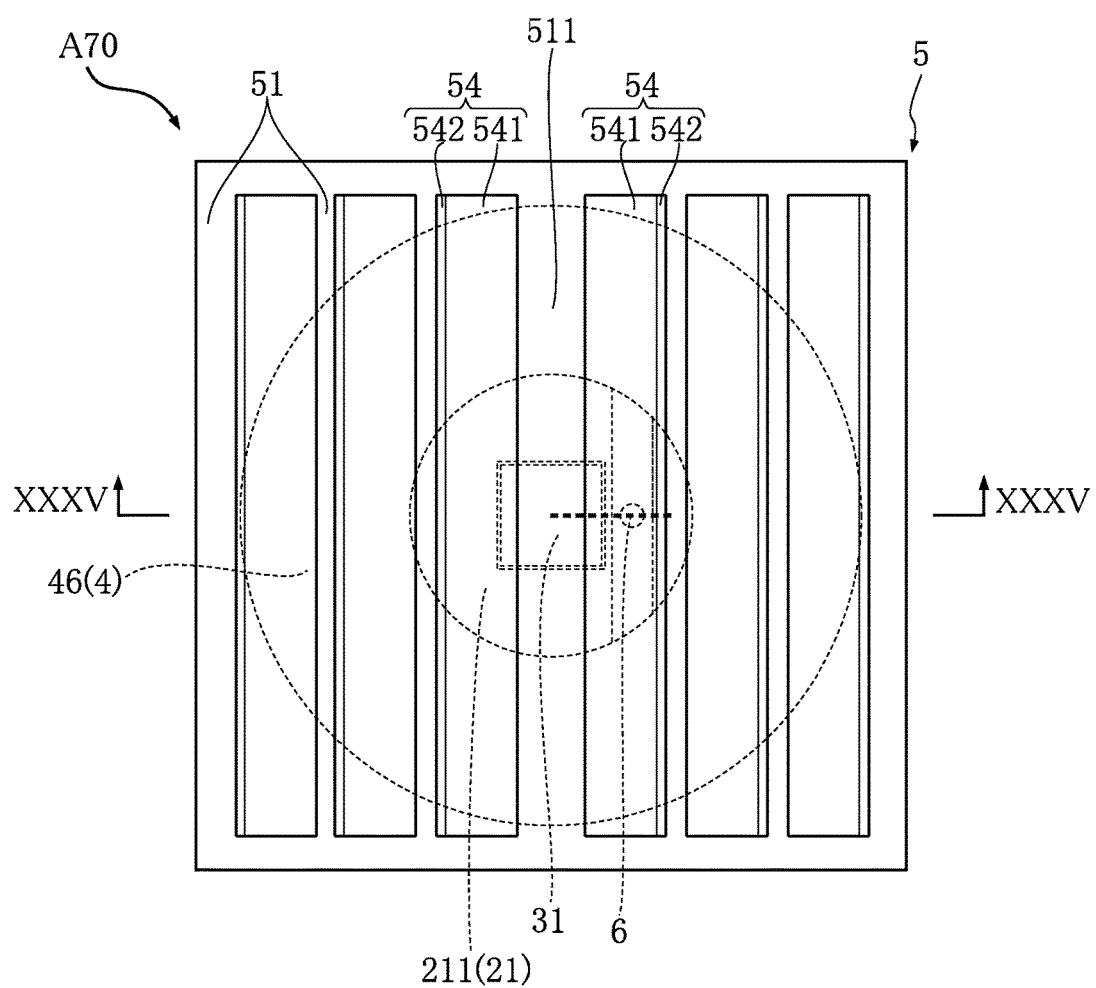
FIG. 34 is a plan view of an LED package according to a seventh embodiment of the present invention.
Figure 35:
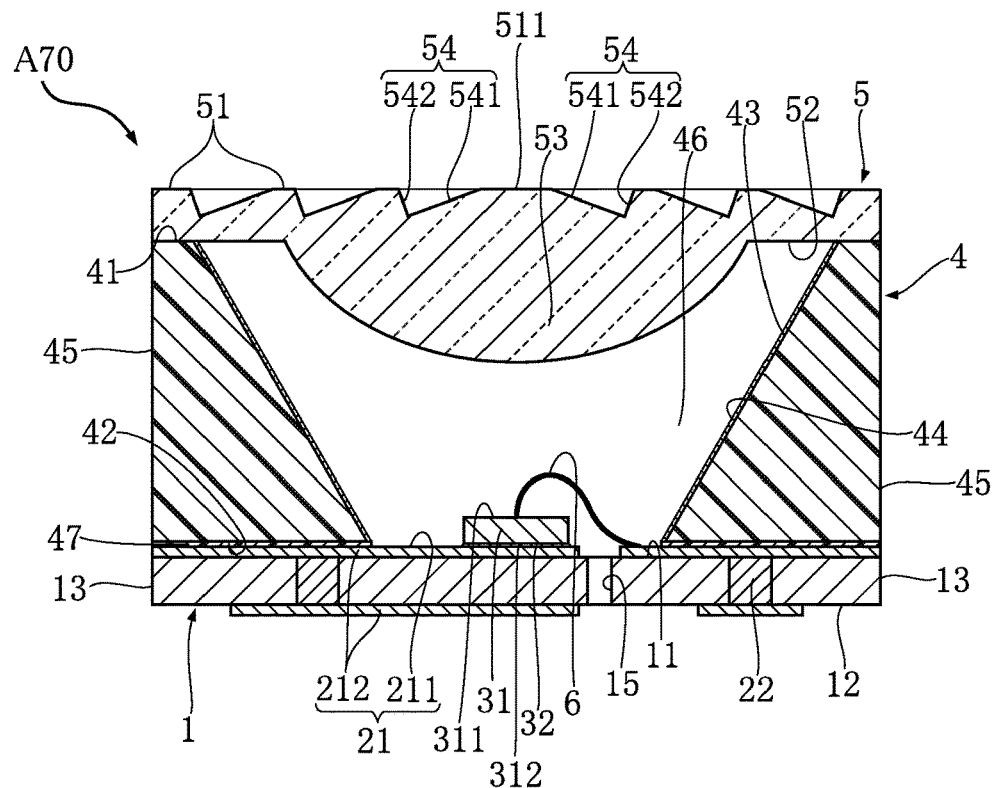
FIG. 35 is a cross-sectional view taken along a line XXXV-XXXV in FIG. 34.
Figure 36:
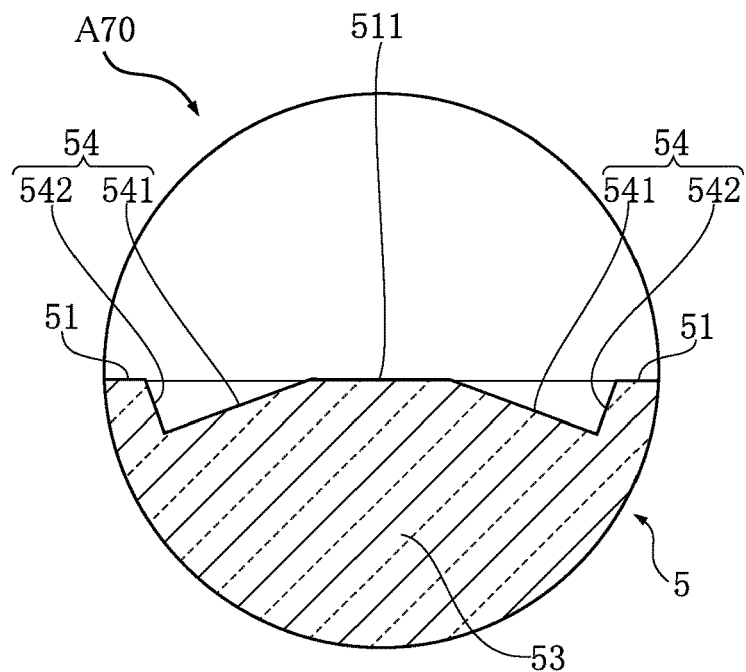
FIG. 36 is a partial enlarged view of FIG. 35.

An LED package A70 according to a seventh embodiment of the present invention will be described with reference to FIGS. 34 to 36. FIG. 34 is a plan view of the LED package A70. FIG. 35 is a cross-sectional view taken along a line XXXV-XXXV in FIG. 34. FIG. 36 is a partial enlarged view of FIG. 35. In this embodiment, the LED package A70 is rectangular in plan view.

In the LED package A70 according to this embodiment, the configuration of the prism portions 54 of the lid 5 is different from that in the above-described LED package A60.

As shown in FIGS. 34 to 36, the top face 51 of the lid 5 includes a central top face 511 that extends in the same direction as the prism portions 54. A portion of the LED element 31 overlaps with the central top face 511 in plan view. The prism portions 54 are positioned on the two edge sides of the central top face 511 in the direction perpendicular to the direction in which the central top face 511 extends, with the first inclined face 541 of each of the prism portions 54 being positioned on the central top face 511 side. On the lid 5 according to this embodiment, three prism portions 54 are formed on each of the two sides of the central top face 511, and the first inclined faces 541 of all of the prism portions are arranged with the central top face 511 therebetween and are directed to the outside of the LED package A70.

The LED package A70 according to this embodiment is obtained by changing the configuration of the lid 5 of the LED package A10, similarly to the LED package A60. The lid 5 according to this embodiment can be applied to any of the LED packages A20, A30, A40 and A50.

According to this embodiment, it also becomes possible to increase the light extraction efficiency while achieving a reduction in the height and size of the LED package A70. Moreover, the top face 51 of the lid 5 according to this embodiment includes the central top face 511 extending in the same direction as the prism portions 54, and the prism portions 54 are positioned on two edge sides of the central top face 511, with the first inclined face 541 of each of the prism portions 54 being positioned on the central top face 511 side. With such a configuration, light that is emitted from the LED element 31 and passes through the lid 5 is refracted so as to be focused in the direction of light transmitted from the central top face 511. Therefore, it is possible to increase the relative intensity of the light emitted from the LED package A70. In this case, that relative intensity can be further increased by adopting a configuration in which a portion of the LED element 31 overlaps with the central top face 511 in plan view.

First Modified Example of Seventh Embodiment

Figure 37:
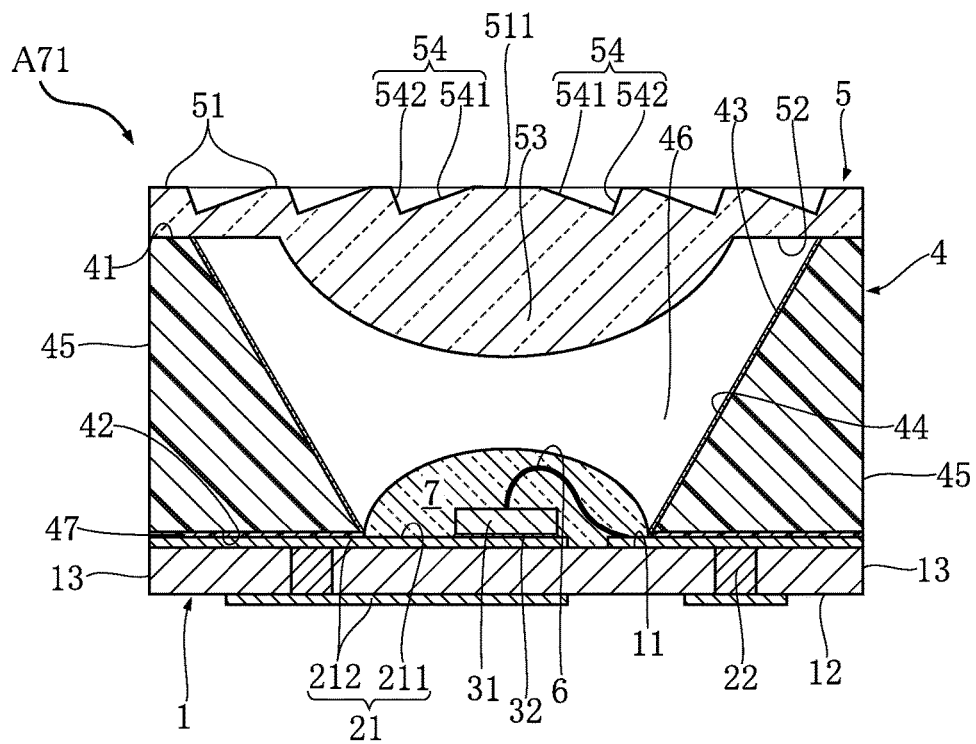
FIG. 37 is a cross-sectional view of an LED package according to a first modified example of the seventh embodiment of the present invention.

An LED package A71 according to a first modified example of the seventh embodiment of the present invention will be described with reference to FIG. 37. FIG. 37 is a cross-sectional view of the LED package A71, and the cross-sectional position thereof is the same as in FIG. 35. The LED package A71 of this modified example is provided with the sealing resin 7 in contrast to the above-described LED package A70. The material, shape and the like of the sealing resin 7 are similar to those in the above-described LED package A11. Note that the board 1 of the LED package A71 does not have the ventilation hole 15 formed therein, unlike the LED package A70.

According to this modified example, it also becomes possible to increase the light extraction efficiency while achieving a reduction in the height and size of the LED package A71. Moreover, the LED package A71 is provided with the sealing resin 7 that fills a portion of the through area 46, and thereby actions and effects similar to those of the LED package A11 are obtained, and it becomes possible to further increase the light extraction efficiency compared to the LED package A70.

Second Modified Example of Seventh Embodiment

Figure 38:
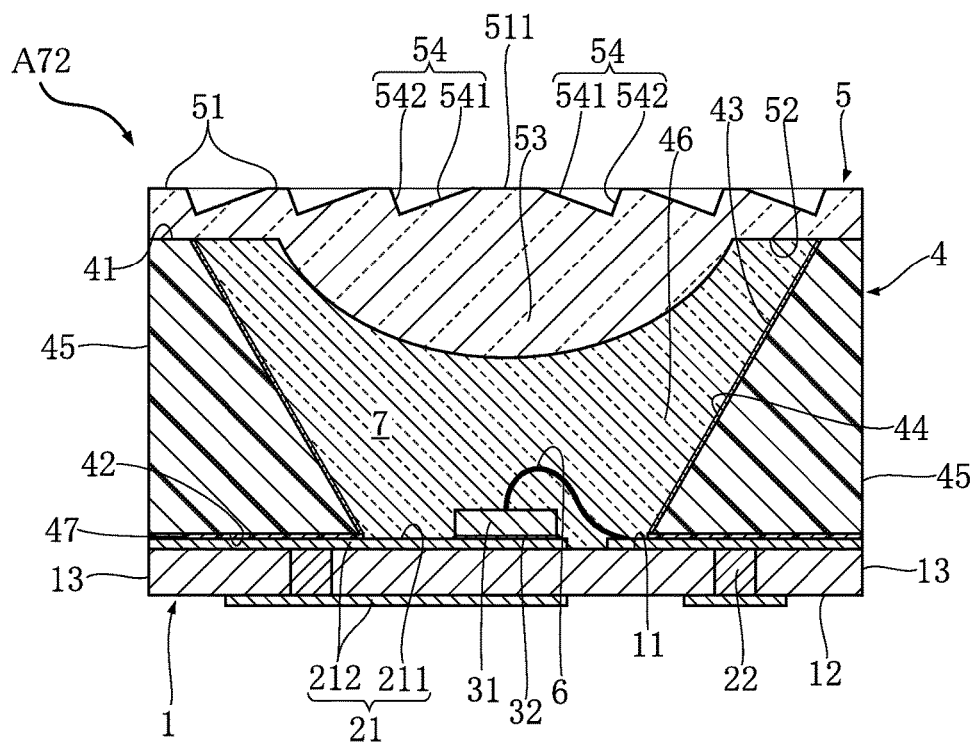
FIG. 38 is a cross-sectional view of an LED package according to a second modified example of the seventh embodiment of the present invention.

An LED package A72 according to a second modified example of the seventh embodiment of the present invention will be described with reference to FIG. 38. FIG. 38 is a cross-sectional view of the LED package A72, and the cross-sectional position thereof is the same as in FIG. 35.

The LED package A72 of this modified example is provided with the sealing resin 7 in contrast to the above-described LED package A70. The material, the shape and the like of the sealing resin 7 are similar to those in the above-described LED package A12. Note that the board 1 of the LED package A72 does not have the ventilation hole 15 formed thereon, unlike the LED package A70.

According to this modified example, it also becomes possible to increase the light extraction efficiency while achieving a reduction in the height and size of the LED package A72. Moreover, the LED package A72 is provided with the sealing resin 7 that fills the entirety of the through area 46, and thereby actions and effects similar to those of the LED package A12 are obtained, and it becomes possible to further increase the light extraction efficiency compared to the above-described LED package A71.

Third Modified Example of Seventh Embodiment

Figure 39:
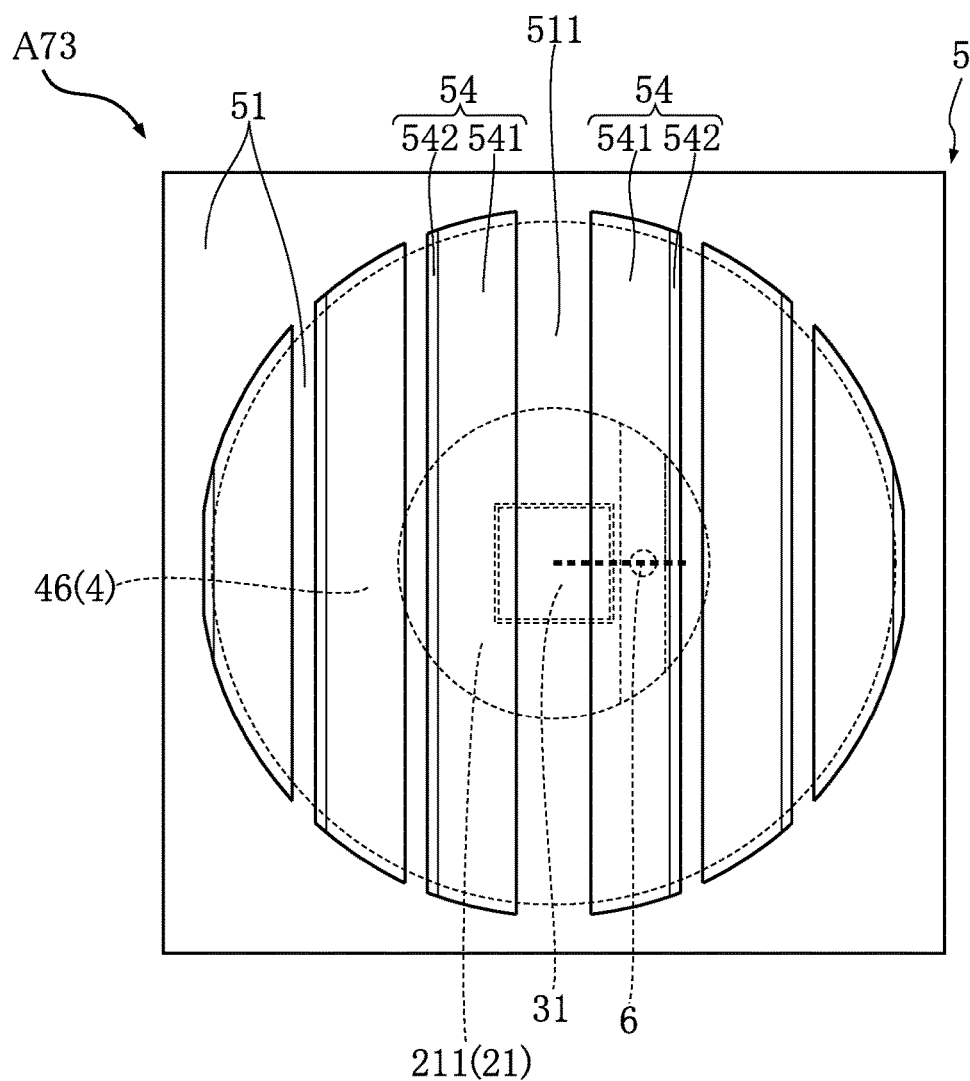
FIG. 39 is a plan view of an LED package according to a third modified example of the seventh embodiment of the present invention.

An LED package A73 according to a third modified example of the seventh embodiment of the present invention will be described with reference to FIG. 39. FIG. 39 is a plan view of the LED package A73.

In the LED package A73 of this modified example, the configuration of the prism portions 54 of the lid 5 is different from that in the above-described LED package A70. The planar view shape of each of the two edges of the prism portions 54 in the direction in which the prism portions 54 extend is arc-shaped along the planar view shape of the through area 46.

According to this modified example, it also becomes possible to increase the light extraction efficiency while achieving a reduction in the height and size of the LED package A73.

The present invention is not limited to the above embodiments and the modified examples thereof. The design of the specific configuration of each constituent element of the present invention can be freely changed in various manners.

The invention claimed is:
1. A package comprising:
a semiconductor element;
a board having an obverse face and a mounting face that face opposite sides from each other,
the obverse face and the mounting face being spaced apart from each other in a thickness direction of the board;
a conductive part formed on both the obverse face and the mounting face of the board and having an installation face upon which the semiconductor element is disposed;
a first bonding wire bonded on the semiconductor element and the conductive part;
a case different from the board,
the case having an end face, a supporting face and a reflective face,
the end face and the supporting face facing opposite sides to each other,
the reflective face being directly joined to both the end face and the supporting face,
the reflective face being disposed between the end face and each of the supporting face and the obverse face in the thickness direction of the board,
at least part of the reflective face being inclined relative to the thickness direction of the board,
the semiconductor element being disposed between the obverse face and the end face in the thickness direction of the board,
the case being formed with a through area that is defined by the reflective face that passes through the case in the thickness direction of the board and that accommodates the semiconductor element,
the through area being wider in the direction parallel to the board surface at the end face side than the support face side of the case,
the supporting face facing the obverse face of the board; and
a lid allowing light to pass there-through and having a top face and a back face that face opposite sides to each other,
the top face being flat,
the back face of the lid facing the end face of the case,
wherein the back face of the lid is formed with a convex lens portion protruding toward the semiconductor element,
the lens portion being accommodated in the through area of the case,
the lens portion overlapping with the inclined part of the reflective face as viewed in a direction perpendicular to the thickness direction of the boards,
the case having an intermediate face and an internal face,
the intermediate face, the internal face and the supporting face forming a recess that is recessed from the supporting face toward the lens portion of the lid, the intermediate face having an edge directly joined to the reflective face, the internal face being directly joined to each of the intermediate face and the supporting face,
the first bonding wire having a portion accommodated in the recess of the case,
the intermediate face facing the obverse face of the board, and
the package further comprising a Zener diode disposed on the installation face of the conductive part with the Zener diode accommodated in the recess;
wherein the board is formed with a ventilation hole that passes through the board from the obverse face to the mounting face and allows external air to circulate there-through, and the ventilation hole passes through to the through area; and
a second bonding wire bonded on the Zener diode and the conductive part, the ventilation hole being disposed between the first and second bonding wires as viewed in the thickness direction of the board.

2. The package according to claim 1, wherein the lid is made of a synthetic resin.

3. The package according to claim 1, wherein the lid is made of a glass.

4. The package according to claim 1, further comprising a sealing resin that covers the semiconductor element and allows light to pass therethrough.

5. The package according to claim 4, wherein the sealing resin is made of a synthetic resin containing a phosphor.

6. The package according to claim 4, wherein the sealing resin comprises a silicone resin.

7. The package according to claim 4, wherein the through area has a portion filled with the sealing resin.

8. The package according to claim 7, wherein the sealing resin is convex.

9. The package according to claim 4, wherein an entirety of the through area is filled with the sealing resin.

10. The package according to claim 1, wherein the reflective face is white.

11. The package according to claim 1, wherein the case is provided with a mirror surface plating layer that covers the reflective face.

12. The package according to claim 11, wherein the mirror surface plating layer contains Au.

13. The package according to claim 1, wherein the conductive part includes plating layers laminated on each other.

14. The package according to claim 13, wherein the plating layers contain Au.

15. The package according to claim 13, further comprising a communication conductive part formed in the board, wherein the communication conductive part is exposed from both the obverse face and the mounting face of the board.

16. The package according to claim 15, wherein the communication conductive part is columnar.

17. The package according to claim 13, wherein the through area is circular in plan view.

18. The package according to claim 17, wherein the reflective face is inclined relative to the supporting face.

19. The package according to claim 17, wherein the reflective face includes: a first reflective face standing up from the supporting face; and a second reflective face that is directly joined to the end face and the first reflective face, and is inclined relative to the supporting face, and
    a boundary portion in which the first reflective face and the second reflective face intersect is circular in plan view.

20. The package according to claim 19, wherein the semiconductor element has an element obverse face formed with a light-emitting portion, and the element obverse face is positioned between the boundary portion and the obverse face of the board in the thickness direction of the board.

21. The package according to claim 1, wherein the first bonding wire includes a first end and a second end that are spaced apart from each other in a length direction of the first bonding wire, and
    one of the first end and the second end is disposed between the intermediate face and the obverse face.

22. The package according to claim 21, wherein one of the first end and the second end overlaps with both intermediate face and the obverse face in plan view.

23. The package according to claim 1, wherein the internal face is disposed between the intermediate face and the supporting face in the thickness direction of the board.

24. The package according to claim 1, wherein the internal face faces the first bonding wire side.

25. The package according to claim 1, wherein each of the conductive part and the board is exposed to the through area.

26. The package according to claim 1, the board, the case, and the lid includes side faces that are flush with each other.

27. The package according to claim 26, the side face of the case is directly joined to both the end face and the supporting face, and is disposed between the end face and the supporting face in the thickness direction of the board, and
    the side face of the case overlaps with the reflective face in the thickness direction of the board.

28. The package according to claim 1, wherein the semiconductor element is an LED element.

29. The package according to claim 1, wherein the semiconductor element and the Zener diode overlap at least partially with each other as viewed in a direction perpendicular to the internal face of the case.

30. The package according to claim 1, wherein the reflective face of the case overlaps with the Zener diode in plan view.

31. The package according to claim 1, wherein the Zener diode comprises an upper face that faces the intermediate face.

32. The package according to claim 1, wherein the edge of the intermediate face is disposed between the semiconductor element and the Zener diode in plan view.

33. The package according to claim 1, wherein the case comprises two upright side faces spaced apart from each other in a direction in which the edge of the intermediate face extends, and the Zener diode is disposed closer to one of the two upright side faces than the other of the two upright side faces.

34. The package according to claim 1, wherein an entirety of the Zener diode is accommodated in the recess.

* * * * *